United States Patent [19]
Goodberlet et al.

[11] Patent Number: 5,892,230
[45] Date of Patent: Apr. 6, 1999

[54] SCINTILLATING FIDUCIAL PATTERNS

[75] Inventors: James G. Goodberlet, Cambridge; Henry I. Smith, Sudbury, both of Mass.

[73] Assignee: Massachusetts Institute of Technology, Cambridge, Mass.

[21] Appl. No.: 865,095

[22] Filed: May 29, 1997

[51] Int. Cl.$^6$ .............................. G01B 15/00; G01J 1/00
[52] U.S. Cl. .................................. 250/361 R; 250/491.1
[58] Field of Search .............................. 250/361 R, 367, 250/483.1, 484.2, 486.1, 491; 428/690, 195

[56] References Cited

U.S. PATENT DOCUMENTS

| | | | |
|---|---|---|---|
| 3,717,764 | 2/1973 | Fujimura et al. | 250/486.1 |
| 5,136,169 | 8/1992 | Smith et al. | |
| 5,187,369 | 2/1993 | Kingsley et al. | 250/367 |
| 5,418,377 | 5/1995 | Tran et al. | 250/483.1 |
| 5,444,266 | 8/1995 | Takeda et al. | 250/486.1 |
| 5,496,502 | 3/1996 | Thomson | 250/361 R |

FOREIGN PATENT DOCUMENTS

| | | | |
|---|---|---|---|
| 6-43110 | 2/1994 | Japan | 250/484.2 |
| 9-102452 A | 4/1997 | Japan . | |

OTHER PUBLICATIONS

J. Vac. Sci. Technol. B 13(6), Nov./Dec. 1995, pp. 2859–2864, "Distributed Bragg Grating Integrated–Optical Filters: Synthesis and Fabrication" by Wong et al.

Microelectronic Engineering 35 (1997) pp. 113–116, "A Nano–composite Resist System: A New Approach to Nanometer Pattern Fabrication" by Ishii, et al.

J. Vac. Sci. Technol. B 14(6), Nov./Dec. 1996, pp. 4009–4013, "Analysis of Distortion in Interferometric Lithography" by Ferrara et al.

J. Vac. Sci. Technol. B 14(6), Nov./Dec. 1996, pp. 4167–4170, "Large–area Achromatic Interferometric Lithography for 100 nm Period Gratings and Grids" by Savas et al.

J. Vac. Sci. Technol. B 10(6), Nov./Dec. 1992, pp. 2530–2535, "Characterization of Near–Field Holography Grating Masks for Optoelectronics Fabricated by Electron Beam Lithography" by Tennant et al.

J. Vac. Sci. Technol. B 11(6), Nov./Dec. 1993, pp. 2155–2163, "Lithographic Patterning of Self–assembled Films" by Jeffrey M. Calvert.

J. Vac. Sci. Technol. B 13(6), Nov./Dec. 1995, pp. 2648–2652, "Immunity to Signal Degradation by Overlayers Using a Novel Spatial–Phase–Matching Alignment System" by Moon et al.

(List continued on next page.)

*Primary Examiner*—Constantine Hannaher
*Assistant Examiner*—Darren M. Jiron
*Attorney, Agent, or Firm*—Samuels, Gauthier & Stevens

[57] ABSTRACT

A scintillating fiducial pattern, and methods of fabricating and using same, on a substrate or a resist/substrate composite, where the scintillating fiducial pattern is used in a spatial referencing scheme. The invention includes the use of a scintillating fiducial pattern as alignment or reference marks on a resist/substrate composite, into which a pattern or feature is to be defined. The invention includes the use of a scintillating fiducial in a mask alignment scheme. The invention includes the use of a scintillating fiducial grid or grating in conjunction with an energy beam locating method, or spatial-phase-locked electron-beam lithography. Spatial referencing to the scintillating fiducial grid, or grating, may be implemented with a delay-locked loop, which locks the phase of a signal from the scintillating grid, or grating, to the phase of a known signal. The invention includes the use of a scintillating fiducial grating, or grid, or the like, in conjunction with energy beam locating, to pattern a distortion-free grating or grid. The invention includes the use of an optical or combined photon/electron detection scheme to detect the scintillating fiducial pattern or a signal from the scintillating fiducial pattern.

33 Claims, 13 Drawing Sheets

OTHER PUBLICATIONS

Belikov et al., "Physical Characteristics of the SOFZ–105 Polymethyl Mathacrylate Secondary Emitter," *Pribory I Tehnika Eksperimenta*, vol. 36, No. 3, (May–Jun. 1993): 85–91.

Goodberlet et al., "A One–Dimensional Demonstration of Spatial–Phase–Locked Electron–Beam Lithography," *Microelectronic Engineering*, vol. 35, No. 1, (Feb. 1997): 473–476.

Ishii et al., "A Nano–Composite Resist System: A New Approach to Nanometer Pattern Fabrication," *Microelectronic Engineering*, vol. 35 No. 1, (Feb. 1997): 113–116.

Goodberlet et al., "Extending Spatial–Phase–Locked Electron–Beam Lithography to Two Dimensions," *Microprocessors and Nanotechnology. $10^{th}$ International Conference (MNC '97)*, vol. 36 No. 12B (Jul. 1997): 7557–7559.

G.F. Knoll, Radiation and Dectection Measurement, Chapter 8, "Scintillation Detector Principles", pp. 215–251, 1989.

SCINTILLATING FIDUCIAL PATTERNS

SCINTILLATING FIDUCIAL PATTERNS

This invention was made with government support under Grant No. DAAH04-95-1-0564 awarded by the U.S. Army. The government has certain rights in the invention.

BACKGROUND OF THE INVENTION

The invention relates to scintillating fiducial patterns and the methods of using and fabricating same.

In electron-beam lithography (EBL), a focused beam of electrons 5 is used to define a pattern 10 in electron-sensitive resist 15, which is on a substrate 20 as shown in FIG. 1A. The pattern is defined in the resist by scanning the electron beam over the resist where the pattern is to be defined. To define the pattern, the electron-beam dose, or current, must be high enough such that when the resist 15 is subsequently developed, the defined pattern 10 will be topographically distinguished as shown in FIGS. 1B and 1C, which depict negative and positive resist, respectively. Typically the sizes of patterns defined are less than 100 µm and can be as small as 10 nm. As an alternative, this type of lithography could also be done with a focused beam of ions, or a focused beam of photons. In that case, the resist must be sensitive to the ions, or photons used.

A method of spatial-phase-locked electron-beam lithography (SPLEBL), or energy beam locating, has been proposed as an improvement to conventional EBL, as described in U.S. Pat. No. 5,136,169. The efficacy of SPLEBL has recently been demonstrated by Wong et al., J. Vac. Sci. Technol. B, Vol. 13, No. 6, p. 2859 (1995). With SPLEBL, the accuracy and precision with which patterns can be defined and placed on the substrate is significantly improved.

In conventional EBL, the patterns are written on a blank substrate and the pattern size and location is defined with respect to mirrors which are mounted on a stage which holds the substrate. The substrate-holding stage can move in two dimensions, $X_s$ and $Y_s$, The positions of the mirrors are determined with two precise interferometers, one for $X_s$ and one for $Y_s$. This is referred to as indirect referencing.

In SPLEBL, direct referencing is employed by placing a fiducial grid 230 on an electron-sensitive resist layer 215 provided on a substrate 220, as shown in FIG. 2. Alternatively, the grid could be placed in close proximity (within millimeters) to the resist/substrate composite. The fiducial grid essentially defines a Cartesian coordinate system on the substrate, to which all patterning is referenced. The grid is of high quality: the spatial period is nearly constant everywhere on the substrate or has known distortion, and the axes of the grid (X',Y') 240, are orthogonal. The spatial period, $\Lambda$, of the grid is typically less than 100 µm, and the thickness of the grid is typically less than 50 nm.

As an electron beam 300 scans across the substrate, as shown in FIG. 3B, the interaction of the beam with the fiducial grid gives rise to a modulated signal 310 as shown in the graph of FIG. 3A. This signal may be used to position the beam with respect to the fiducial grid. Since the scanning beam is positioned with respect to the grid, then all patterns are directly referenced to the grid, which is on, or in close proximity to, the resist.

The fiducial grid on the resist/substrate composite, which is used for SPLEBL, has been described typically as being fabricated from islands of resist on a thin layer of metal, or islands of metal over the resist. When an electron beam is incident on any material, secondary electrons (SE) are emitted, which have energies below 50 eV. The number of SE emitted depends upon the type of material. So, as the electron beam scans across a grid of metal islands on resist, or resist islands on metal, the number of SE emitted varies from metal island to resist. Consequently the SE signal 310 is modulated, as shown in FIG. 3A.

The quality of the modulated signal from the fiducial grid must be high for accurate and precise pattern definition and placement in SPLEBL or energy beam locating. One measure of signal quality, is the signal's contrast, C, which is defined as $$C = S_{max}/S_{min}$$

where $S_{max}$ is the maximum value of the signal and $S_{min}$ is the minimum value of the signal, as indicated in FIG. 3A. Another measure of the signal's quality is the amount of amplitude noise on the signal. Amplitude noise is random fluctuations in the signals amplitude, and is indicated in FIG. 3A. If the amplitude noise is large and the signal's contrast is small, then it is difficult to detect the modulation produced by the fiducial grid. This is typically the case in SPLEBL, when secondary electrons are used.

A disadvantage with SE detection of the fiducial grid, as just described, is that all materials emit secondary electrons. And the maximum ratio in SE yield between any two materials is typically less than 2. Consequently, the maximum contrast from any fiducial grid will be typically less than 2.

SUMMARY OF THE INVENTION

A scintillating fiducial pattern, and methods of fabricating and using same, on a substrate or a resist/substrate composite, where the scintillating fiducial pattern is used in a spatial referencing scheme. The invention includes the use of a scintillating fiducial pattern as alignment or reference marks on a resist/substrate composite, into which a pattern or feature is to be defined. The invention includes the use of a scintillating fiducial pattern in a mask alignment scheme. The invention includes the use of a scintillating fiducial grid or grating in conjunction with an energy beam locating method, or spatial-phase-locked electron-beam lithography. Spatial referencing to the scintillating fiducial grid, or grating, may be implemented with a delay-locked loop, which locks the phase of a signal from the scintillating grid, or grating, to the phase of a known signal. The invention includes the use of a scintillating fiducial grating, or grid, or the like, in conjunction with energy beam locating, to pattern a distortion-free grating or grid. The invention includes the use of an optical or combined photon/electron detection scheme to detect the scintillating fiducial pattern or a signal from the scintillating fiducial pattern.

In general, the invention includes the fabrication of a fiducial pattern from a scintillator and the use of same. The scintillator is located on, or in, the resist/substrate composite. The scintillator is designed to efficiently emit photons when it is struck by an incident beam of electrons, ions, or photons.

In an exemplary embodiment, the invention is located on the back side of an electron-, ion-, or photon-transparent resist/substrate composite, such as an x-ray mask.

In another exemplary embodiment, the invention is fabricated from an organic scintillating compound or polymer. The basic elements in an organic scintillator are carbon, hydrogen and oxygen.

In another exemplary embodiment, the invention is fabricated from an inorganic scintillating compound. Inorganic scintillators contain elements other than carbon, hydrogen and oxygen. Typically, inorganic scintillators contain a host crystal and often have an impurity doped into the crystal in small amounts.

In another exemplary embodiment, the invention is fabricated from a scintillator which contains buckeyballs, C-60 for example, or photoluminescent nanocrystals, such as ZnS-passivated CdSe crystals, which are typically less than 20 nm in diameter.

In another exemplary embodiment, the invention is fabricated from a scintillating-resist composite. In this scheme, the scintillator is doped into a suitable resist, or the resist itself is designed to scintillate, or the resist is converted to a scintillator by the addition of appropriate compounds or molecules, such that the scintillating-resist composite may be directly patterned into a fiducial pattern.

In another exemplary embodiment, a scintillating fiducial grid is composed of two scintillators, which emit at distinct wavelengths. One scintillator will be assigned to the X' axis of the grid, and the other to the Y' axis.

In another exemplary embodiment, a scintillating fiducial grid is composed of one scintillator, which has two different spatial periods. One spatial period will be assigned to the X' axis, and the other to the Y' axis.

In another exemplary embodiment, a fiducial grid is composed of a scintillating and a non-scintillating grating. The scintillating grating may be assigned to the X' axis, and the non-scintillating grating may be assigned to the Y' axis. The non-scintillating grating may be detected by other means, such as secondary-electron detection.

In another exemplary embodiment, the invention is used in conjunction with spatially-phase-locked scanning-beam lithography, or energy beam locating.

In another exemplary embodiment, photons emitted from the invention, when an energetic beam is scanned across the invention, are detected with a photodetector.

In another exemplary embodiment, the invention is used in conjunction with energy beam locating and a delay-locked loop, which is used to track the movement, or locate the spatial position, of a energetic beam which is scanning across the scintillating grid or grating.

In another exemplary embodiment, the invention is used in conjunction with energy beam locating, where the invention is oriented at an angle, θ, with respect to the direction of the scanning beam.

In another exemplary embodiment, the invention is used in conjunction with spatial-phase-locked electron beam lithography, or any scanning beam lithography, to pattern a distortion-free grating, which may then be used to pattern a distortion-free grating or grid.

In another exemplary embodiment, the invention is used for spatial referencing or alignment, where the photons from a scintillating pattern on one fixture may be compared to photons from a pattern on another fixture, and the two fixtures are then aligned or spatially positioned by using the detected signals from each fixture.

In another exemplary embodiment, the invention is used for spatial referencing or alignment, where the photons from a scintillating pattern on one fixture may be obscured by a pattern on another fixture, and the two fixtures are then aligned or spatially positioned by using the detected signal.

A scintillator, as used herein, refers to any scintillating material, either an organic composite, an inorganic composite, or a combination thereof. In addition, for purposes of describing the invention, a scintillator includes any fluorescent or luminescent materials.

A photodetector, as used herein, refers to any device which produces an electronic signal when struck by photons of any wavelength. This could include photodiodes and photomultipliers.

A fiducial pattern, as used herein, is any arbitrarily shaped pattern, of which a fiducial grid or fiducial grating is a subset, that may be used as a spatial reference mark. For the application of energy beam locating, the fiducial pattern may cover the area of the resist/substrate composite into which a pattern is to be defined with the scanning beam. The fiducial pattern may also be located in areas into which a pattern will not be defined.

A fiducial grid, as used herein, is a two-dimensional array of fiducial marks. Preferably, the marks are spaced at regular periodic intervals.

A fiducial grating, as used herein, is a one-dimensional array of fiducial lines. Preferably, the lines are spaced at regular periodic intervals.

Systematic distortion, as used herein, refers to a predictable variation in the spatial period, or phase, of a fiducial grating or fiducial grid.

A resist/substrate composite, as used herein, is the composite onto, or into, which any desired pattern is to be defined.

Resist, as used herein, refers to any substance which undergoes a change when subjected to a scanning beam, which imparts an exposure dose of electrons, ions or photons to the resist.

A beam, as used herein, is a beam of electrons, ions, or photons which is used to define a pattern in said resist/substrate composite.

Photons, as used herein, are electromagnetic radiation at wavelengths ranging from the x-ray region to the infrared region of the spectrum.

A modulated or periodic signal, as used herein, refers to a signal which has a variation in amplitude, which is regular in time.

A phase difference, $\Delta\phi$, as used herein, refers to a difference in phase between any two periodic signals. For example, the phase of one periodic signal might be $\phi_1$, and the phase of another signal might be $\phi_2$. The phase difference between the two signals would then be described by $\Delta\phi=\phi_1-\phi_2$.

Pattern, as used herein, refers to any distinguishing feature that may be defined in, or on, any resist/substrate composite.

EBL, as used herein, is an acronym for electron-beam lithography.

SPLEBL, as used herein, is an acronym for spatial-phase-locked electron-beam lithography, which is a subset of energy beam locating.

DLL, as used herein, is an acronym for delay-locked loop.

X, Y, as used herein, refer to the coordinate axes of a scanning-beam lithography system. For example, if the beam is initially at $X_0, Y_0$ and moves in the X-direction, then at a later time the beam will be at $X_1, Y_0$.

X', Y', as used herein, refers to the coordinate axes of a fiducial grid or grating.

θ, as used herein, refers to the angular rotation of the X, Y axes of the scanning beam relative to the X', Y' axes of the fiducial grid or grating.

φ, as used herein, refers to the phase of a periodic structure or periodic signal.

DETAILED DESCRIPTION OF THE ILLUSTRATED EMBODIMENTS

Scintillators have been used for the detection of high energy particles or photons for many years. Note G. F. Knoll, *Radiation and Detection Measurement,* 2nd Ed., John Wiley and Sons, New York, N.Y., p. 215–250, (1989). A scintillator emits a photon, which may be in the visible range, when it is struck by a high energy particle or high energy photon. Typically, the photon is emitted very quickly, within tens of nanoseconds for some scintillators, and the number of photons emitted per incident particle can be very high, hundreds or thousands of photons per incident particle for a well-designed scintillator.

There are generally two categories of scintillators, organic and inorganic. Organic scintillators are composed primarily of three basic elements, carbon, hydrogen, and oxygen. These elements can be bound together in molecules, and there may be several different molecules in an organic scintillator. Inorganic scintillators contain elements other than, or in addition to, carbon, hydrogen and oxygen. Often, inorganic scintillators are made of a host crystal, such as calcium fluoride ($CaF_2$), which may have a trace impurity, such as europium (Eu), doped into it. By selecting and combining elements, compounds, molecules or crystals, scintillators can be designed for a specific application, and can be made to emit photons efficiently.

Figure 4A:
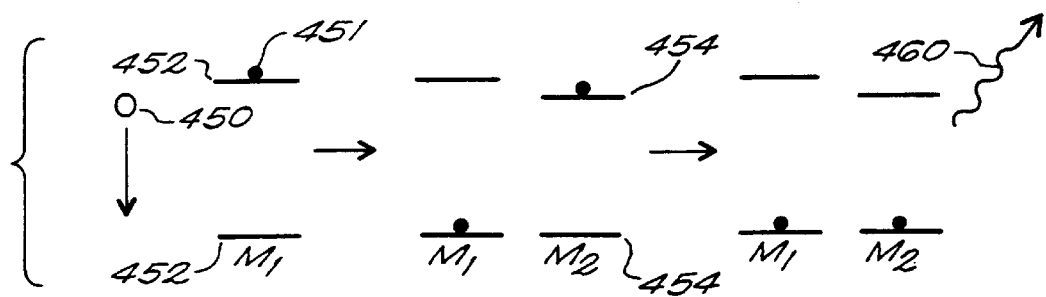
FIGS. 4A and 4B are diagrammatic representations of organic and inorganic scintillation processes, respectively.
Figure 4B:
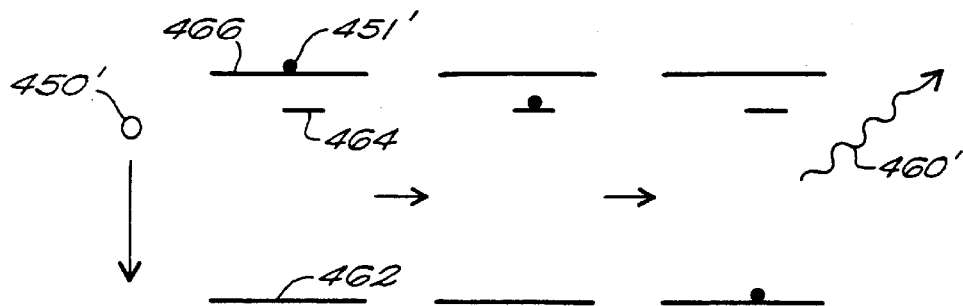

Generally, the scintillation process is at least a two-step process. The multistep processes for organic and inorganic scintillators are shown in FIGS. 4A and 4B. The figures depict excitation and de-excitation of individual elements, compounds or molecules that comprise the scintillator.

An organic scintillation process is illustrated in FIG. 4A. First, some energy from an incident particle 450 is transferred to a molecule, $M_1$ 452. The energy may then be transferred nonradiatively to a nearby fluorescent molecule, $M_2$ 454. The fluorescent molecule is then in an excited energy state with the electron 451 in a higher energy level. When the molecule de-excites, it emits a photon 460. This photon may be detected, or it may excite a different fluorescent molecule which undergoes the same process.

For the process of an inorganic scintillation, as shown in FIG. 4B, an incident particle 450' excites an electron 451' into the host crystal's conduction band 466. This electron may then de-excite to an impurity state 464 between the conduction band 466 and valence band 462. Subsequent decay back to the valence band results in the emission of a photon 460'.

Figure 1A:
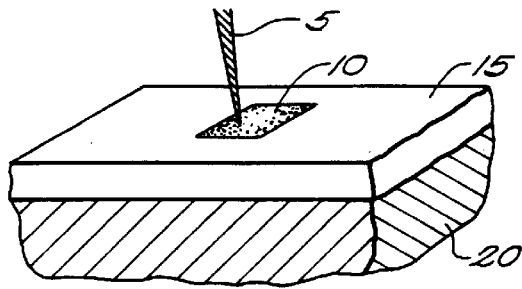
FIGS. 1A–1C are perspective views of a resist/substrate composite undergoing an electron-beam lithography process.
Figure 1B:
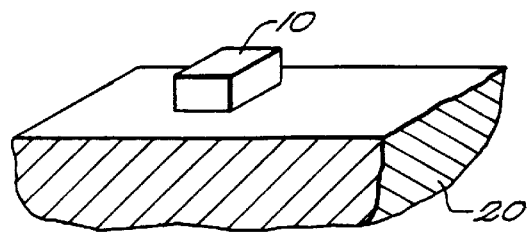
Figure 1C:
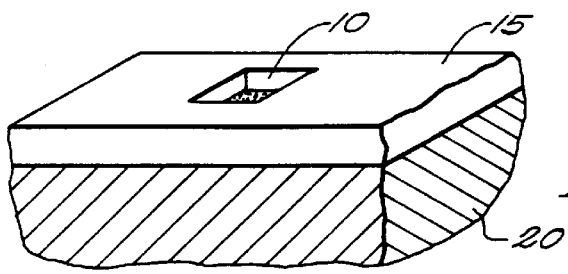
Figure 2:
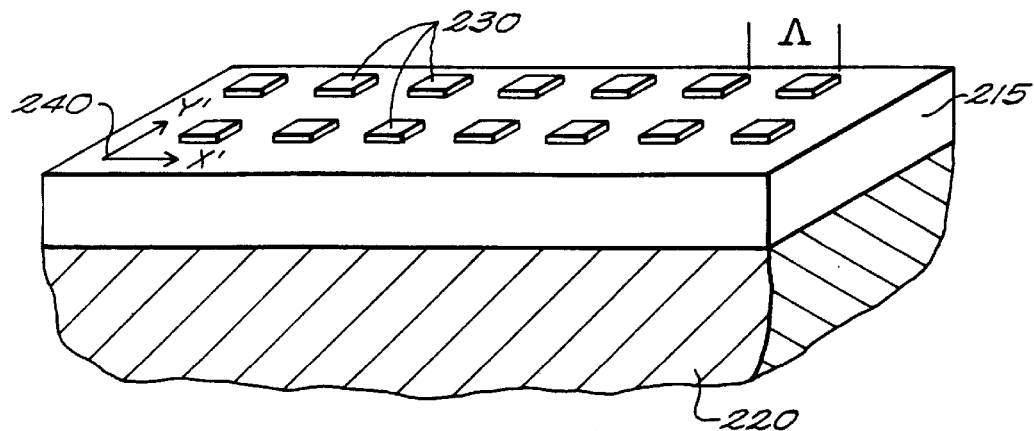
FIG. 2 is a plan view of a fiducial pattern on a resist/substrate composite.
Figure 3A:
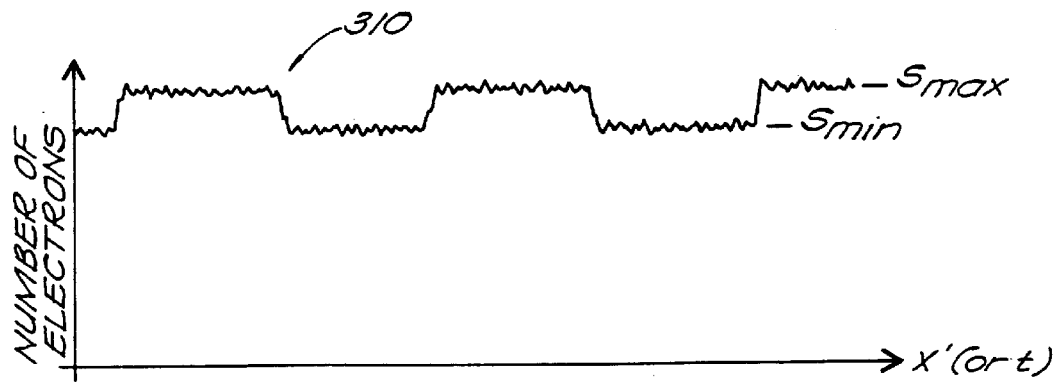
FIG. 3A is a graph of a modulated electron signal.
Figure 3B:
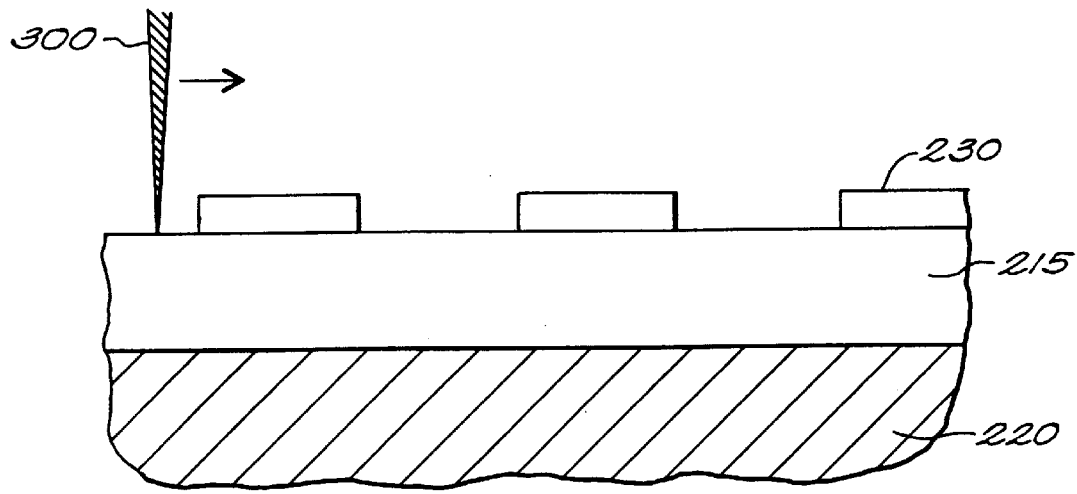
FIG. 3B is a cross sectional view of the fiducial pattern and resist/composite of FIG. 2 having an energy beam scanning thereacross to derive the signal of FIG. 3A.
Figure 5A:
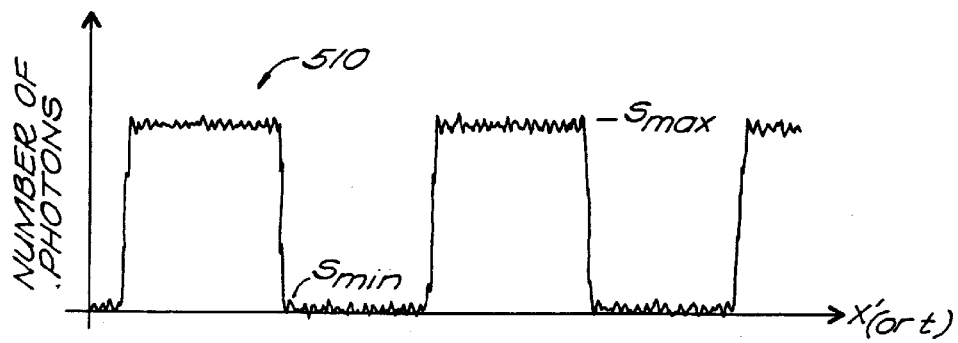
FIG. 5A is a graph of a modulated photonic signal.
Figure 5B:
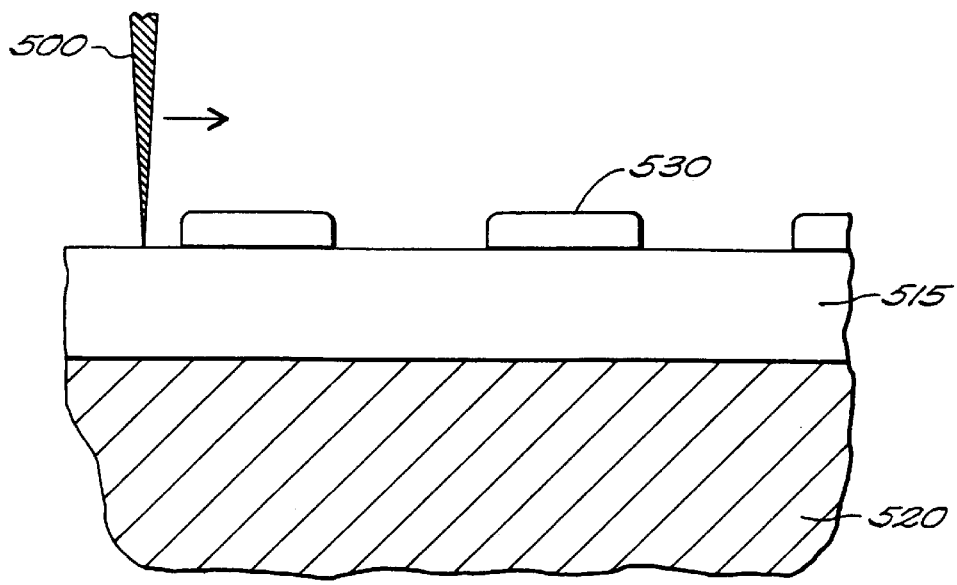
FIG. 5B is a cross-sectional view of a scintillating fiducial pattern and resist/composite having an energy beam scanning thereacross to derive the signal of FIG. 5A.

The invention described herein proposes the fabrication of a fiducial pattern from a scintillator. The advantage in using a scintillator is improved signal contrast from the fiducial pattern. Since the scintillator emits photons in a specific wavelength region, then these photons will only be emitted from regions on the substrate where the scintillator is located. If a fiducial pattern is a grid of islands of scintillators 530, on a layer of electron-sensitive resist 515 provided on a substrate 520, to be used in energy beam locating, then the photons will be emitted only when a scanning beam 500 strikes an island as shown in FIGS. 5A and 5B. The resulting modulated photon signal 510 will have a large contrast value as shown in the graph of FIG. 5A. The results should be compared to the SE electron case, shown in FIGS. 3A and 3B. Consequently, the signal's contrast from a scintillating grid or grating can approach an infinite value, theoretically.

Figure 6:
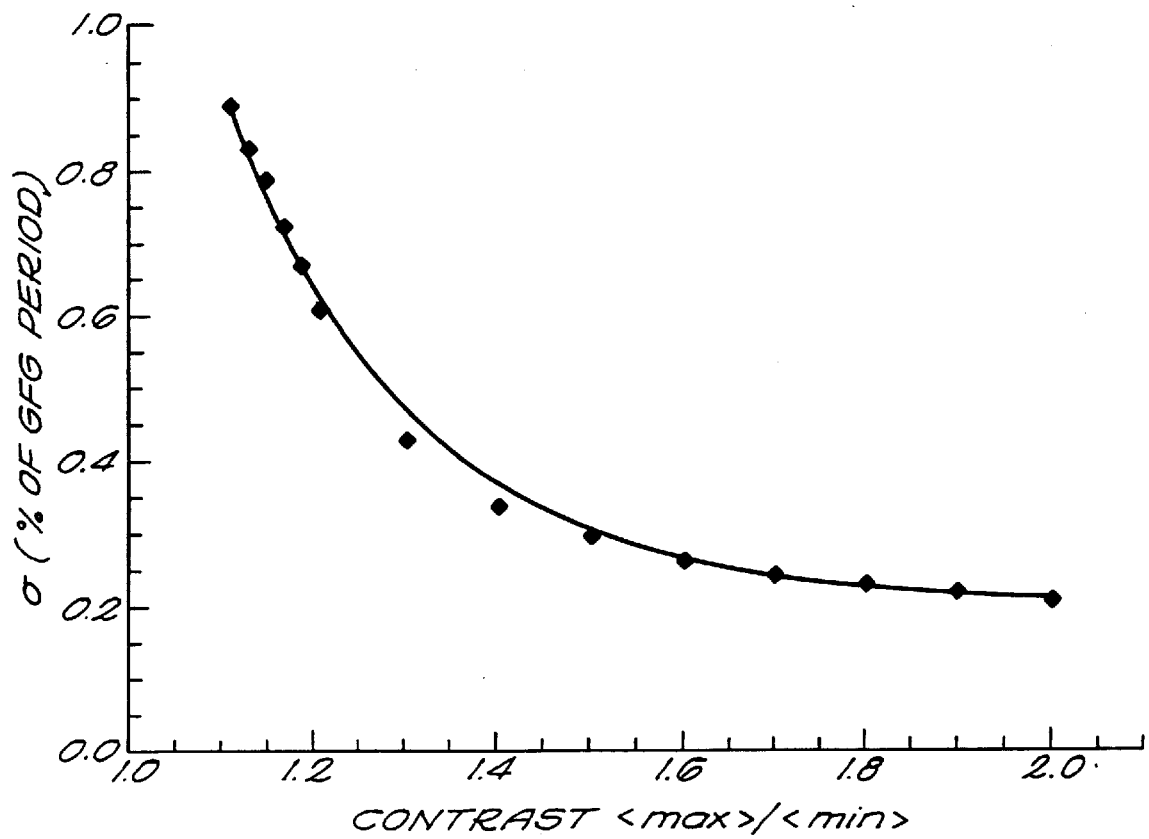
FIG. 6 is a graph of the uncertainty, σ, in locating a scanning energy beam with respect to a fiducial grid as a function of the contrast of a signal derived from the fiducial grid.

The advantage of larger contrast for energy beam locating is made clear in the graph of FIG. 6. This graph is the result of a numerical model of spatial-phase locking. The graph represents the scanning beam positioning error, or uncertainty, as a function of signal contrast. An uncertainty of 1% means that the scanning beam's location can be known to within 1/100th of the grid's spatial period. Clearly, high signal contrast results in better beam positioning, and pattern definition, in SPLEBL.

There is a further advantage to using an organic scintillating fiducial grid or grating in conjunction with energy beam locating. Organic substances are fabricated from elements with low atomic number. Elements with low atomic number will scatter an electron beam less than elements with high atomic number. Consequently, the electron beam will scatter less when passing through an organic scintillating fiducial pattern than it would when passing through a metallic fiducial pattern.

Figure 7:
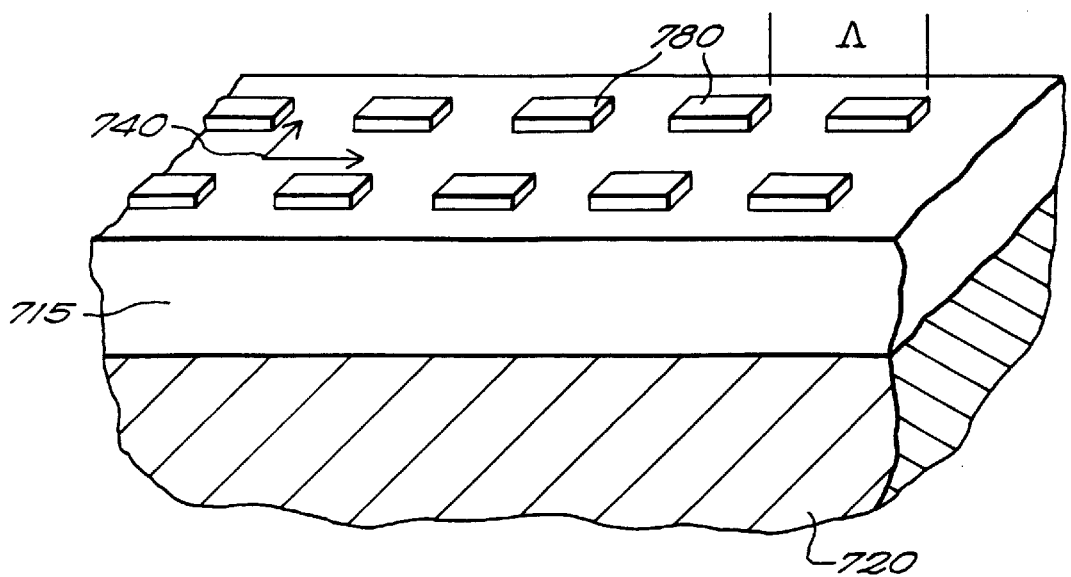
FIG. 7 is a plan view of a scintillating fiducial pattern on a resist/substrate composite.

FIG. 7 is a perspective view of a basic configuration for a scintillating fiducial pattern 780 having a plurality of islands on a resist/substrate composite. In this embodiment, a scintillating grid is located on top of a resist layer 715, which is in turn located on top of a substrate 720. The X' and Y' axes 740 of the fiducial pattern are chosen to follow the spaces between the islands of the pattern 780. The spatial period of the pattern, $\Lambda$, is typically less than 100 $\mu$m.

In the illustrated exemplary embodiment, the fiducial pattern 780 is comprised of an organic scintillator. An organic scintillator generally includes several organic compounds or molecules. Organic compounds or molecules, for example, are typically composed of carbon, hydrogen and oxygen. Often, the scintillators are contained within a host polymer. Examples of organic scintillators include BC-400, BC-422, BC-428 and BC-430, which are commercially available from Saint-Gobain/Norton Industrial Ceramics Corporation. The wavelength of maximum emission from these scintillators is 423 nm (BC-400), 370 nm (BC-422), 480 nm (BC-428) and 580 nm (BC-430). These are a subset of polymer-based scintillators supplied by this company and are provided for purposes of illustration.

The scintillating fiducial pattern 780 is alternatively comprised of a scintillating-resist composite. Such a composite is designed specifically as a scintillating resist. For example, the scintillating-resist composite will have the properties of resist. In other words, patterns may be defined in it. The scintillating-resist composite may be exposed with optical radiation or a particle beam. Also, the scintillating-resist composite will scintillate when struck by a particle or photon beam.

The scintillating fiducial pattern 780 is alternatively comprised of a commercially available resist which has been converted into a scintillator by the addition of appropriate scintillating components. An example of this is described by Belikov et al., Instr. and Exper. Tech., Vol. 36, No. 3, p. 386–389 (1993). The commercially available resist, polymethal methacrylate (PMMA) can be converted to a scintillating resist by the addition of scintillating compounds. Three compounds, naphthalene, POP and POPOP, were added to PMMA to convert it to a scintillating resist. These compounds are well known to those skilled in the art. In this scintillating-resist composite, the naphthalene receives energy from the incident beam, which is scanning over the grid. It acts as the molecule $M_1$ 452 of FIG. 4A. This energy is then transferred to the fluorescent molecules POP and POPOP.

In an alternative conversion of resist to a scintillating resist, or in the design of a new scintillating resist, buckeyballs (C-60 molecules or the like) (as described by Ishii et al., *Proceedings of the International Conference on Micro- and Nanofabrication*, Elsevier, Amsterdam, Holland, p. 113–116 (1996)) or photoluminescent nanocrystals (as described by Murray et al., J. Amer. Chem. Soc., Vol. 115, p. 8706, (1993)) can be substituted for one of the compounds in the scintillator composite. For example, buckeyballs have a composition similar to naphthalene. Both contain carbon rings. Buckeyballs have diameters less than 2 nm, and can be substituted for naphthalene in the aforementioned conversion of PMMA. Alternatively, buckeyballs can be used in a new scintillating-resist composite. Photoluminescent nanocrystals, such as zinc-sulfide (ZnS)-passivated cadmium-selenide (CdSe) nanocrystals, can convert more than 50% of incident photons into emitted photons. The nanocrystals are typically less than 20 nm in diameter, and could be substituted for one of the fluorescent molecules in the aforementioned conversion of PMMA. Alternatively, photoluminescent nanocrystals can be used in a new scintillating-resist composite.

The scintillating fiducial pattern 780 is alternatively comprised of an inorganic scintillator. Examples of inorganic scintillators include thallium-doped sodium-iodide, NaI(Tl), sodium-doped cesium-iodide CsI(Na), and europium-doped calcium-fluoride, $CaF_2$(Eu). The emission wavelengths of these scintillators are 415 nm (NaI(Tl)), 430 nm (CsI(Na)), and 435 nm ($CaF_2$(Eu)). Such inorganic scintillators are commercially available from Saint-Gobain/Norton Industrial Ceramics Corporation. These are a subset of commercially available inorganic scintillators and are provided for purposes of illustration.

Figure 8:
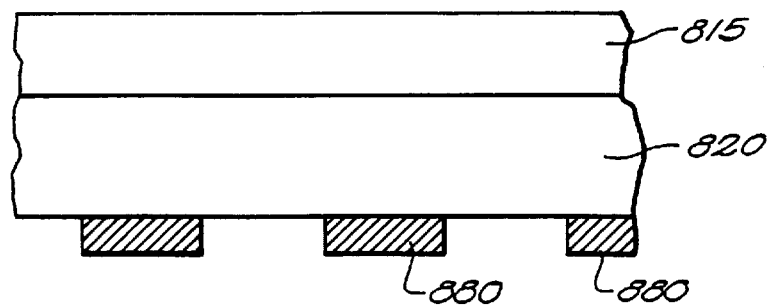
FIG. 8 is a cross-sectional view of a scintillating fiducial pattern on the back side of a thin substrate.

FIG. 8 shows an alternative exemplary embodiment which includes a scintillating fiducial pattern 880 and a resist/substrate composite. In this arrangement, the scintillating fiducial pattern 880 is located on the back side of a thin substrate 820, and a resist layer 815 is located on the front side of the thin substrate. The substrate is thin enough so that the particle beam or photon beam may be transmitted through it and subsequently excite the scintillating pattern 880.

Figure 9A:
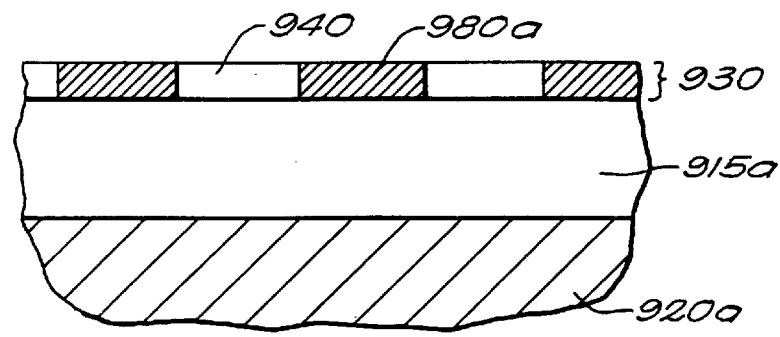
FIGS. 9A–9E are cross-sectional views of various scintillating fiducial pattern and resist/substrate composite arrangements.

FIGS. 9A–9E show alternative exemplary embodiments of the invention. In FIG. 9A, a uniform layer 930 of scintillating and non-scintillating material is located on top of a resist layer 915*a*, which in turn is on a substrate 920*a*. In this arrangement, the inverse of the desired scintillating fiducial pattern is defined with a resist 940, and a scintillating fiducial pattern 980*a* is deposited into the mold defined by the resist 940. This may be accomplished by the technique of spin coating and planarization, which is known to those skilled in the art.

Alternatively, the uniform layer 930 may be comprised entirely of the scintillating material and the regions 940 may be regions of the formed scintillator which have been damaged by some means so that they no longer scintillate. Some types of scintillators are known to damage if exposed to high levels of radiation, or to quench if they absorb certain materials or elements such as oxygen. The scintillating material of the scintillating fiducial pattern 980*a* and the resist layer 915*a* may be separated by an intermediate layer of material as well, such as a thin layer of metal, to facilitate the removal of scintillating material after the resist has been exposed.

Figure 9B:
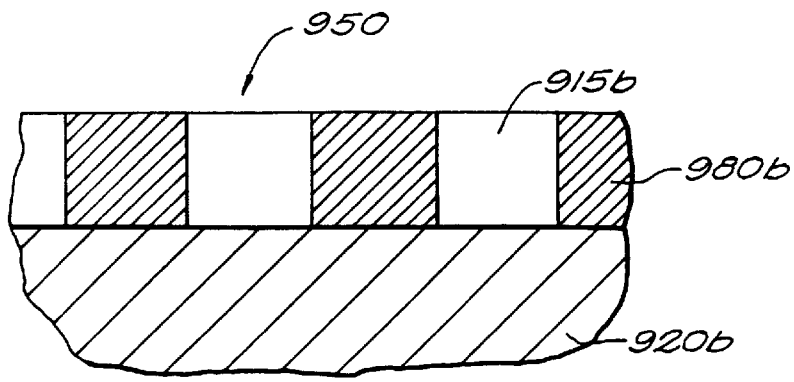

FIG. 9B shows an alternative exemplary embodiment in which a scintillating resist forms a scintillating fiducial pattern 980*b* and is located in the resist 915*b*, both of which are located on a substrate 920*b*. In this configuration, the scintillating resist of the pattern 980*b* and the resist 915*b* have nearly identical resist properties, and thus define a resist layer 950. This structure can be fabricated by the planarization technique described with reference to FIG. 9A, or similar conventional methods known to those skilled in the art. In one implementation, the scintillating resist composite forming the pattern 980*b* is converted PMMA, and the non-scintillating regions defined by resist 915*b* are standard PMMA. Alternatively, the entire resist layer 950 may be composed of a scintillating resist and the non-scintillating regions are damaged scintillator, as described with reference to FIG. 9A.

Figure 9C:
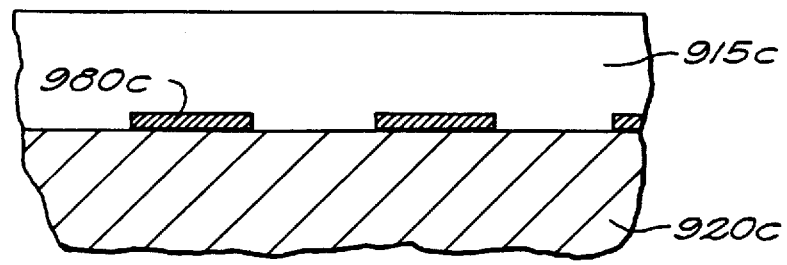

FIG. 9C shows an alternative exemplary embodiment in which a scintillating fiducial pattern 980c is located directly on a substrate 920c. A resist layer 915c, is deposited over the top of the scintillating fiducial pattern.

Figure 9D:
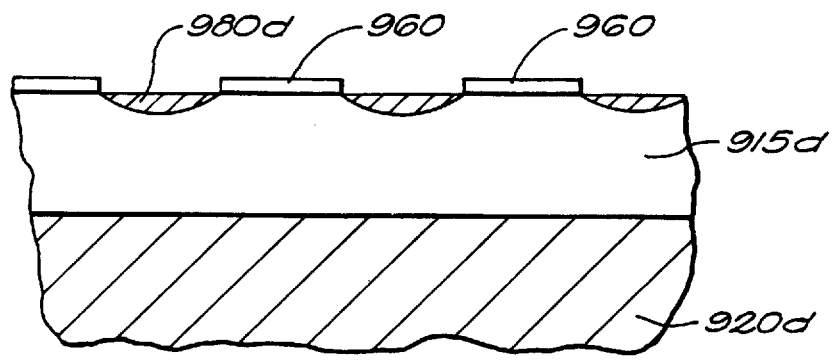

FIG. 9D shows an alternative exemplary embodiment in which a scintillating fiducial pattern 980d is defined in the top surface of a resist layer 915d, which in turn is provided on a substrate 920d. For this configuration, the resist layer 915d contains all the necessary compounds for a scintillator, except one, which is subsequently sprayed into, or printed into, or diffused into the resist layer 915d. In the regions where the necessary scintillating compound is deposited, the resist layer 915d will scintillate. The necessary scintillating compound may be blocked from adjacent regions with a thin surface layer 960, which can be metal or a resist which has no scintillating compounds.

Figure 9E:
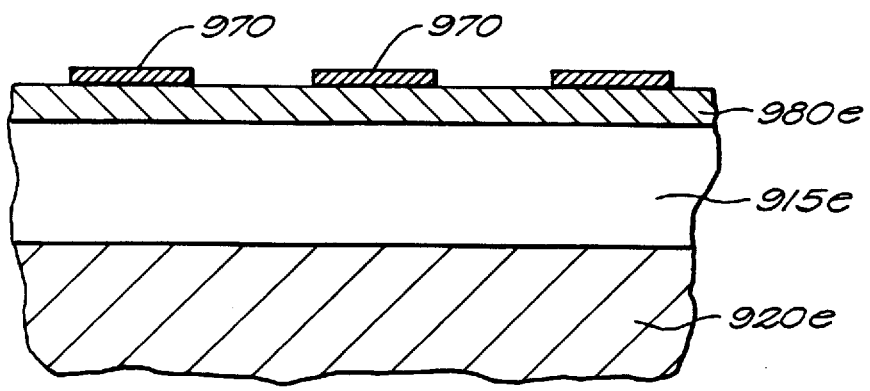

In FIG. 9E a thin uniform layer of scintillator 980e is spun on top of the resist layer 915e. A fiducial pattern 970 of absorbing or opaque material is patterned above the scintillating layer. The fiducial pattern blocks light emitted from the underlying scintillator.

The scintillating fiducial patterns of the invention can be fabricated by several means or processes known to those skilled in the art. The fabrication methods can include interferometric lithography (IL) (as described by Ferrera et al., J. Vac. Sci. Technol. B, Vol. 14, No. 6, p. 4009–4013 (1996)), achromatic interferometric lithography (AIL) (as described by Savas et al., J. Vac. Sci. Technol. B, Vol. 14, No. 6, p. 4167–4170 (1996)), electron-beam lithography (EBL), near-field holography (NFH) (as described by Tennant et al., J. Vac. Sci. Technol. B, Vol. 11, No. 6, p. 2509–2513 (1993)), ion-beam lithography, optical proximity lithography, optical projection lithography, x-ray lithography, imprint lithography, near-field lithography, electrospray techniques, self-assembly techniques, printing techniques, lift-off techniques, or embossing techniques. All of the previously listed articles are incorporated herein by reference. There may be several processing steps involved in fabricating the invention.

Figure 10A:
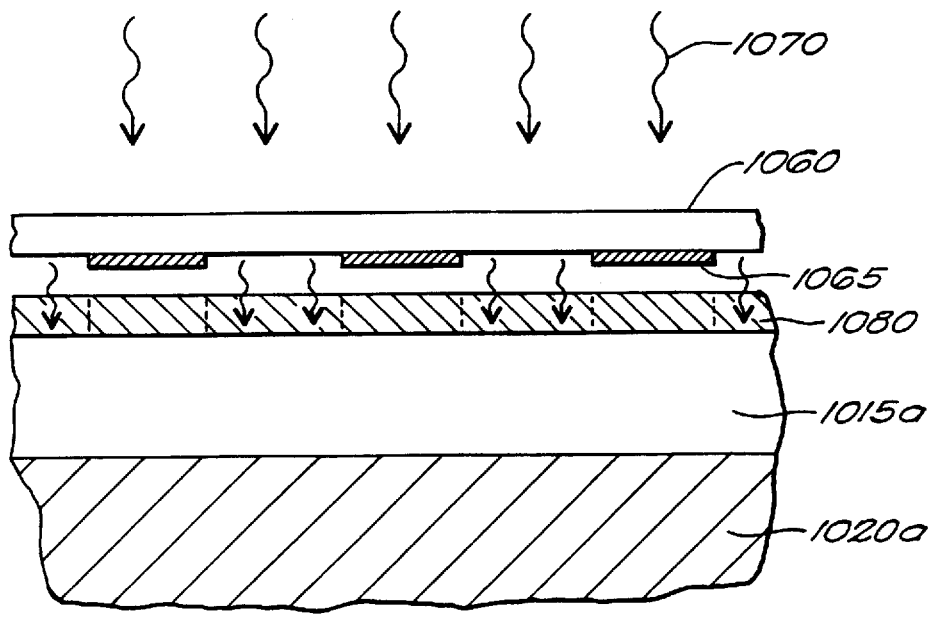
FIGS. 10A–10D depict various methods by which a scintillating fiducial pattern may be defined.

The exemplary embodiment illustrated in FIG. 7 can be fabricated in several process steps, one of which involves optical proximity lithography as shown in FIG. 10A. First, a particle- or photon-beam resist layer 1015a is spun onto a substrate 1020a. Then, a thin layer of scintillating resist 1080 is spun on top of this resist. The scintillating resist 1080 will have different exposure properties from the particle- or photon-beam resist 1015a. For example, the radiation which exposes 1080 will not expose the resist 1015a. Next, an optical mask 1060 with masking pattern 1065 is brought into contact, or in close proximity to, the scintillating resist 1080. The resist 1080 is then exposed with radiation 1070 which passes through the mask. Subsequent development in solution will result in the desired structure shown in FIG. 7.

Figure 10B:
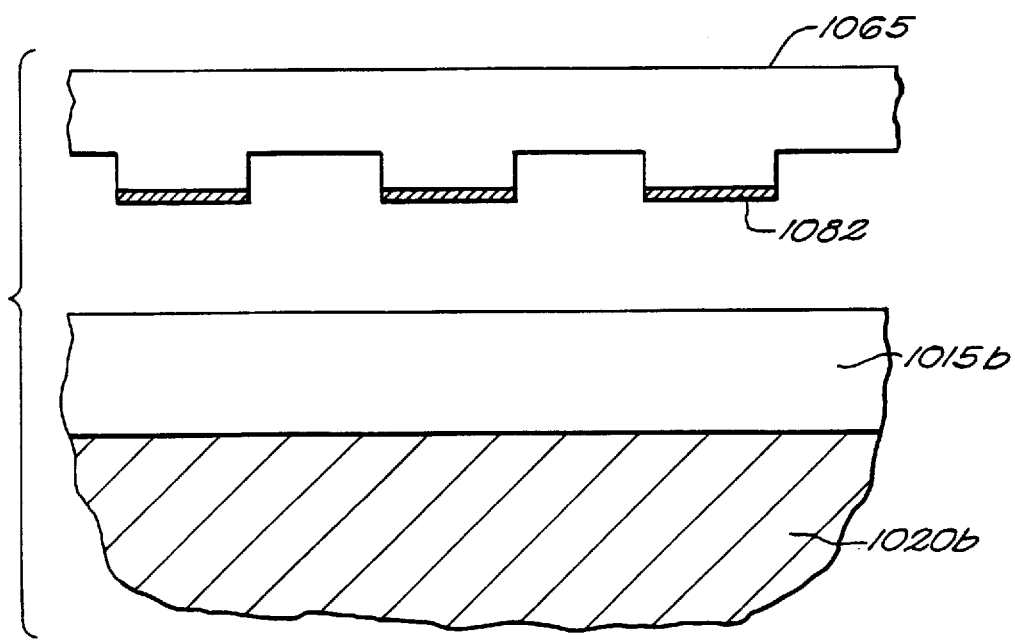

FIG. 10B depicts an alternative method of patterning a scintillating fiducial grating or grid in accordance with the invention. In this printing technique, a rigid mask 1065 is used to apply a substance 1082 to the resist/substrate composite 1015b,1020b. The rigid mask has the fiducial pattern defined on it. The mask is first dipped into a container of scintillating material, and then pressed against the resist/substrate composite, similar to the method of ink stamping. The substance 1082 can be the scintillator. Alternatively, the substance 1082 can be one scintillating component which is to be added to the remaining scintillating components located in the resist 1015b. In this scheme, the addition of the substance 1082 to the resist creates a scintillating fiducial pattern in the resist, as described with reference to FIG. 9D. Alternatively, the substance 1082 can be a material to which a scintillator adheres. In this implementation, the adhering agent is applied to the resist/substrate composite. Then, the resist/substrate composite with adhering agent has a scintillator exposed to the surface with the adhering agent. The scintillator will then stick to regions where the adhering agent is located, and will not stick to regions where there is no adhering agent.

Figure 10C:
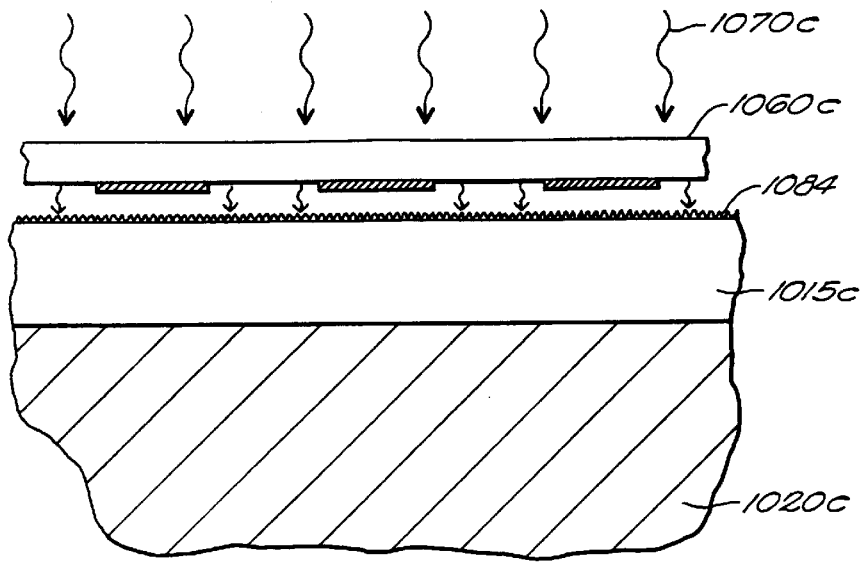

In FIG. 10C, an alternative method for fabricating a scintillating fiducial pattern in accordance with the invention is shown. This method is similar to the method described with reference to FIG. 10A, except a thin layer of a substance 1084 is provided on top of a resist layer 1015c. Exposure of the thin substance 1084 to radiation 1070c via a mask 1060c changes the adhesion property of the substance to the scintillator. For example, the scintillator might normally adhere to the substance 1084. However, exposure of the substance 1084 to radiation causes a loss of adhesion of the scintillator to the substance 1084. When scintillating material is then exposed to the surface of the resist/substrate composite with the substance 1084, the scintillator will adhere to the substance 1084 only in unexposed areas. This will then define a scintillating pattern on the resist/substrate composite. A technique which might be adapted for this fabrication process is described by J. Calvert, "Lithographic patterning of self-assembled films", J. Vac. Sci. Technol., vol. 11, p.2155 (1993), incorporated herein by reference.

Figure 10D:
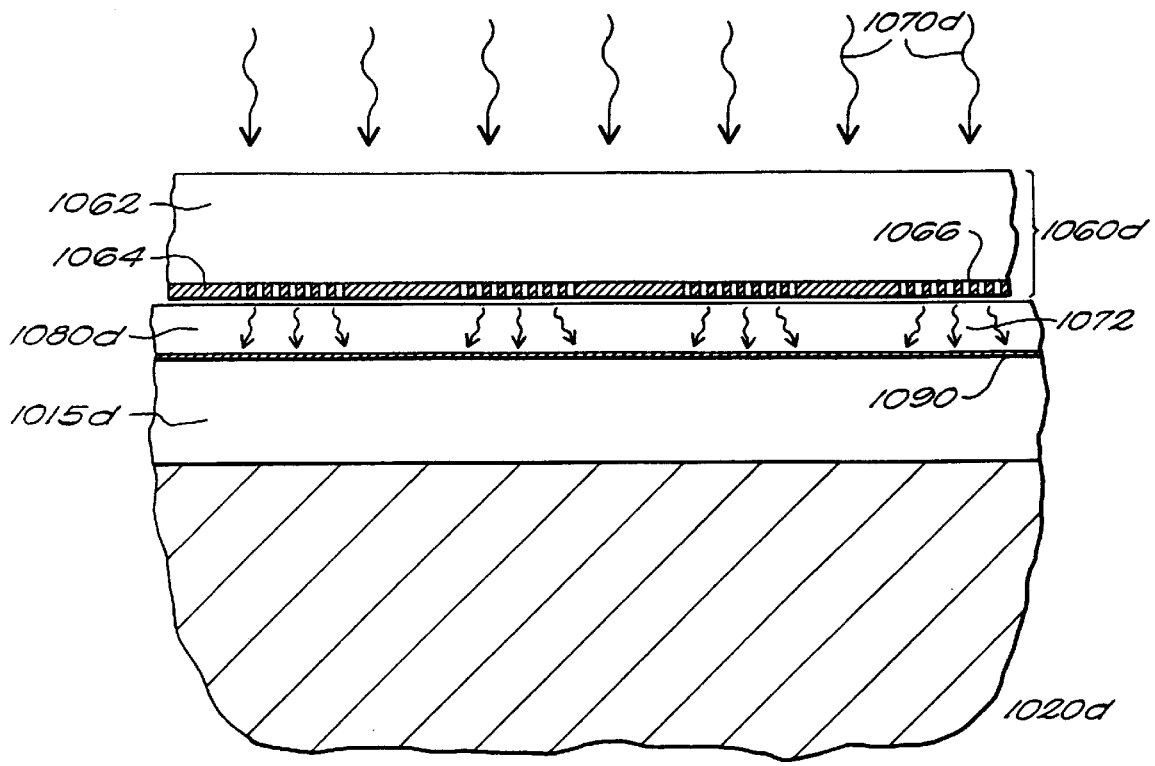

Another exemplary method of fabricating a scintillating fiducial pattern in accordance with the invention is shown in FIG. 10D. This method allows patterning of a scintillator composite 1080d with radiation which may also expose a layer of resist 1015d. However, this method takes advantage of near-field techniques and a thin metallic intermediate layer 1090 to prevent radiation 1070d from reaching the resist 1015d. In this method, the thin metallic layer 1090, such as aluminum, is deposited on the resist/substrate composite 1015d,1020d. The thickness of this layer can be less than 5 nm. The resist-scintillator composite 1080d is then spun on top of the intermediate layer. A near-field optical mask 1060d is then placed in contact with the resist-scintillator surface.

The mask 1060d consists of a substrate 1062, which is transparent to the exposing radiation 1070d, and a patterned optically-opaque layer 1064. The pattern in the optically-opaque layer 1064 is defined by fabricating small holes through the layer. The diameter of these holes are less then the wavelength of the exposing radiation. In regions 1066 where small holes are made, the exposing radiation 1070d will transmit evanescently through the holes. Since the transmitted field 1072 is evanescent, it cannot extend far in to the resist/substrate composite. By adjusting the hole diameters, the extent of the radiation 1072 can be made to match the thickness of the scintillator composite 1080d. The intermediate metallic layer 1090 further reduces the amount of transmitted radiation 1072 into the resist 1015d. The metallic layer 1090 will also assist in the removal of the scintillator 1080d prior to development of the resist 1015d.

Figure 11A:
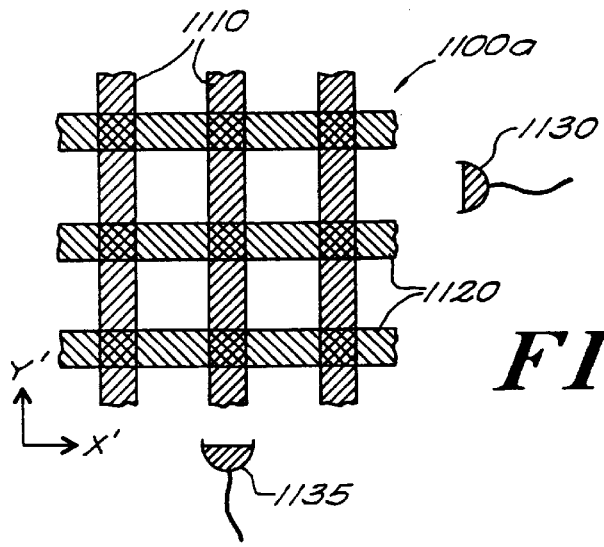
FIGS. 11A–11C are plan views of various scintillating fiducial pattern designs.

In an exemplary embodiment of the invention as shown in FIG. 11A, a scintillating fiducial pattern or grid 1100a is fabricated from two scintillating fiducial gratings 1110, 1120. The gratings are oriented at an angle of 90 degrees to each other. One grating 1110 is assigned to the X' axis and will scintillate at a predetermined wavelength, $\lambda_1$, while the other grating 1120 is assigned to the Y' axis and will scintillate at some other predetermined wavelength, $\lambda_2$. Such a two-wavelength scintillating fiducial grid 1100a will permit easy distinction between the X' and Y', axes of the grid. A photodetector 1130, sensitive to $\lambda_1$, but not to $\lambda_2$, will be used to detect a signal from the X'-axis grating 1110, and another photodetector 1135, sensitive to $\lambda_2$ but not to $\lambda_1$, is used to detect a signal from the Y'-axis grating 1120. Each of the scintillating fiducial gratings can be patterned with any of the aforementioned fabrication methods.

Figure 11B:
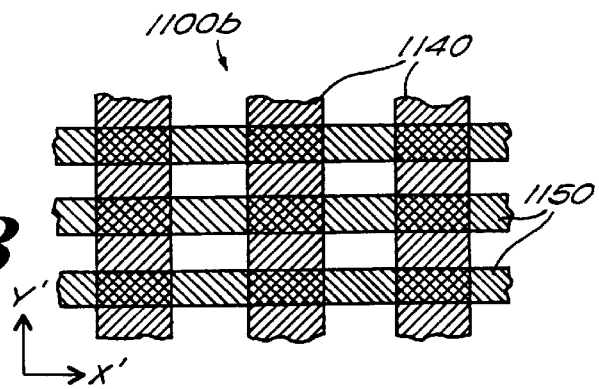

In another exemplary embodiment of the invention as shown in FIG. 11B, a scintillating fiducial grid 1100b is fabricated from two scintillating fiducial gratings 1140, 1150. The gratings are oriented at an angle of 90 degrees to each other. One grating 1140 is assigned to the X' axis and has one spatial period, $\Lambda_1$, while the other grating 1150 is assigned to the Y' axis and has another spatial period, $\Lambda_2$. The gratings may scintillate at the same or different wavelengths. Signals from the gratings are detected with one or two photodetectors (not shown). The difference in spatial periods will facilitate distinction between the X' and Y' axes.

Figure 11C:
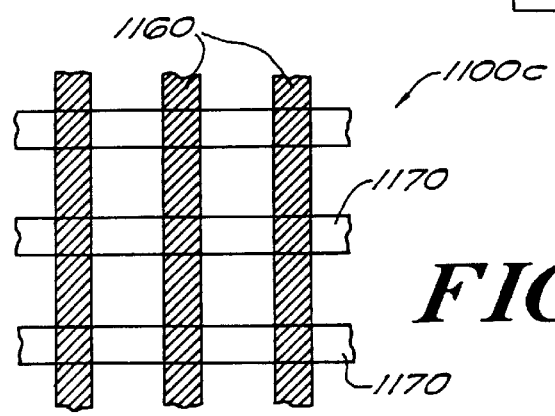

In yet another exemplary embodiment of the invention as shown in FIG. 11C, a scintillating fiducial grating 1160 is combined with a non-scintillating fiducial grating 1170 to define a scintillating/non-scintillating fiducial grid 1100c. The scintillating grating 1160 is assigned to one axis, X' or Y', while the non-scintillating grating 1170 is assigned to the other axis, Y' or X'. The signal from the scintillating grating is detected with a photodetector, while the signal from the other grating is detected by other means, for example, secondary-electron detection. Such a scintillating/non-scintillating fiducial grid will permit easy distinction between the X' and Y' axes.

Any of the aforementioned scintillating fiducial patterns may be used in conjunction with spatial-phase-locked electron-beam lithography, or energy beam locating as described in U.S. Pat. No. 5,136,169, incorporated herein by reference. In this application, the energy beam is scanned across the pattern, and the interaction of the energy beam with the grid gives rise to a periodic or quasiperiodic photonic signal. This operation was described with reference to FIGS. 5A and 5B. The photonic signal is detected with a suitable photodetector, or photodetectors for the two-wavelength scintillating grid, and converted to a periodic or quasiperiodic electronic signal, which is used in energy beam locating to reference the energy beam to the fiducial grid.

Figure 12A:
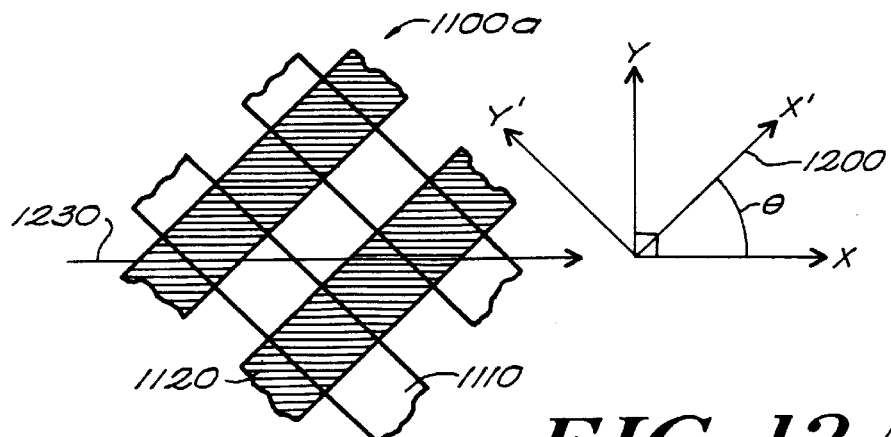
FIG. 12A is a plan view of a scintillating fiducial grid oriented at an angle, θ, with respect to the direction of a scanning energy beam.
Figure 12B:
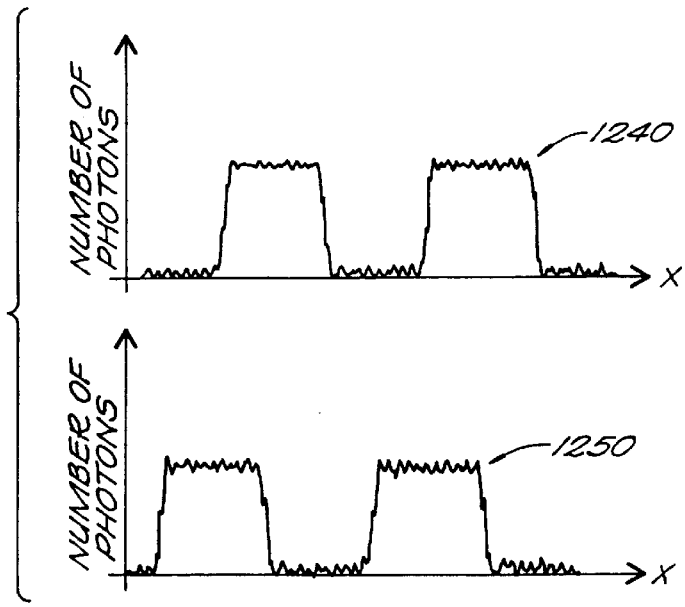
FIG. 12B is a graph of two photonic signals derived from the fiducial grid of FIG. 12A.

Any of the aforementioned scintillating fiducial patterns may also be used in conjunction with energy beam locating techniques as shown in FIGS. 12A and 12B. In FIG. 12A, the axes X', Y' 1200 of a scintillating fiducial grid are oriented at an angle $\theta$ with respect to the scanning-beam axes X,Y 1210. For example, the previously described two-wavelength scintillating fiducial grid 1100a of FIG. 11A can be used as the fiducial grid in spatial-phase-locked electron beam lithography. The grid may be oriented such that the X', Y' axes 1200 of the fiducial grid is at an angle of 45 degrees with respect to the X, Y axes 1210 of the scanning-electron beam.

As the electron beam scans along a path 1230 in the X direction, both the X' grating 1110 and the Y' grating 1120 will scintillate, giving rise to two periodically modulated photon signals 1240, 1250 which are at different wavelengths as shown in the graph of FIG. 12B. Photodetectors can be used to convert these signals into two distinct electronic signals. Thus, information about the X' and Y' position of the scanning beam can be inferred from the signals emitted from the two gratings. For example, if the beam's scan path were shifted slightly vertically or horizontally or some combination thereof, then the signals 1240, 1250 would have different phases.

Any of the aforementioned scintillating fiducial patterns, gratings or grids can be used in conjunction with energy beam locating and a delay-locked loop (DLL) (as described by Lee et al., IEEE J. Sol. St. Circ., Vol. SC-27, p. 1736–1746 (1992)) to provide the necessary beam-position correction signal for energy beam locating. For example, a shift in the beam's scan path, or a shift in the signals' phases as described with reference to FIGS. 12A and 12B, can be detected with a delay-locked loop. Delay-locked loops are well described in the technical literature and are typically used in communication systems.

Figure 13:
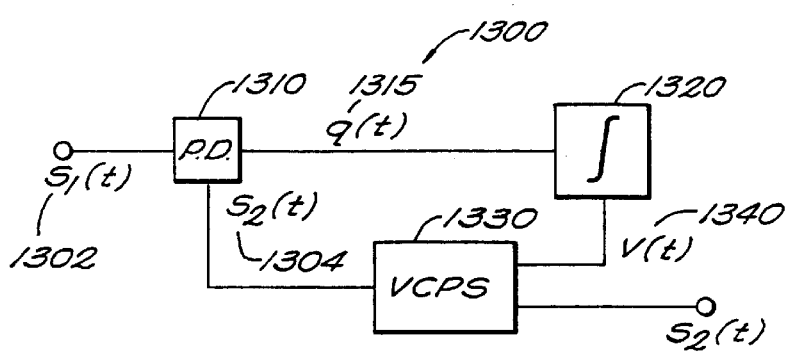
FIG. 13 is a schematic block diagram of a basic delay-locked loop.

The basic operating principle of a delay-locked loop 1300 is shown in block diagram form in FIG. 13. Two periodic signals 1302, 1304 are input into a phase detector (PD) or phase comparator 1310. One of the input signals, 1302 for example, has a known phase, $\phi_1(t)$, and the other signal 1304 has an unknown phase, $\phi_2(t)$. The phase detector 1310 detects a difference in phase, $\Delta\phi(t)=\phi_1(t)-\phi_2(t)$ between the two input signals and outputs a signal, q(t) 1315, which is proportional to the phase difference $\Delta\phi(t)$. The signal q(t) is integrated by an integrator 1320, and the resulting signal V(t) 1340 is then applied to a voltage-controlled phase shifter (VCPS) 1330, which shifts the phase of one of the signals, 1304. The phase is shifted such that the phase difference, $\Delta\phi(t)$, between the input signals 1302 and 1304 is maintained at a constant value. Consequently, the phases of the two signals are locked together. In the spatial-phase-locked electron beam application, the scanning-electron beam will act as the VCPS 1330.

Figure 14:
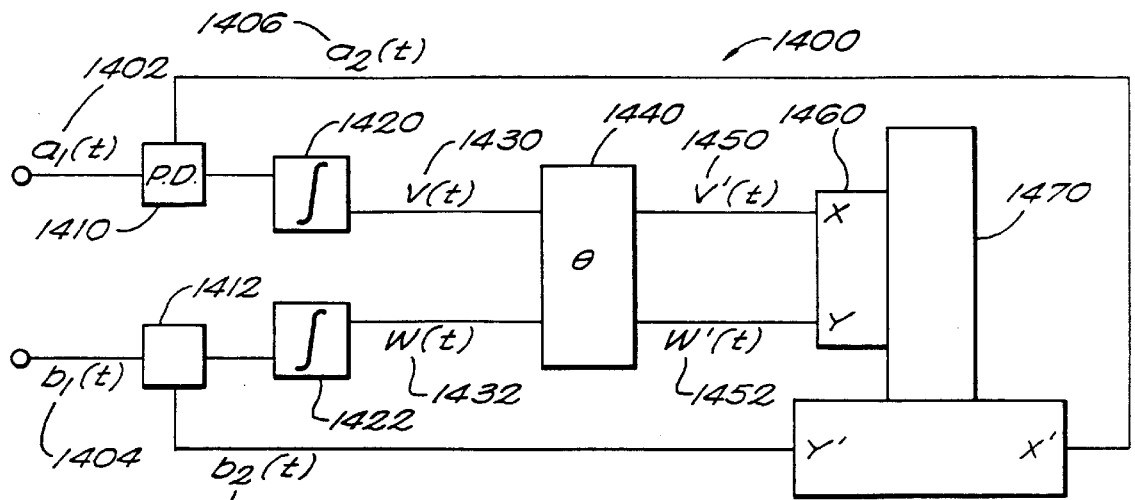
FIG. 14 is a schematic block diagram of two delay-locked loops used in combination for spatial-phase locking in two dimensions.

A block diagram of a delay-locked loop 1400, which is designed for two-dimensional spatial-phase-locked electron-beam lithography, is shown in FIG. 14. Two DLLs are combined in this application. One DLL is used for spatial-phase-locking to the X' axis of a fiducial grid and the other is used for spatial-phase locking to the Y' axis of a fiducial grid. An X' -axis signal, $a_2(t)$ 1406, derived from the fiducial grid used in an EBL system 1470 is sent to a phase detector 1410, which detects a phase difference between the X'-axis signal 1406 and a known signal, $a_1(t)$ 1402. The phase detector 1410 outputs a signal which is subsequently integrated by an integrator 1420, and then sent to a rotation unit 1440.

The DLL for spatial-phase-locking to the Y' axis works similarly. For the Y' axis, a phase detector 1412 senses a phase difference between the Y'-axis signal, $b_2(t)$ 1408, and another known signal, $b_1(t)$ 1404. The two signals with known phases 1402, 1404 can be derived from a system operating clock (not shown), which outputs a periodic signal of know frequency and phase. In the EBL system 1470, which preferably has a continuously moving substrate stage, one or both of the known signals 1402, 1404 may be synchronized to the stage's movement. Alternatively, one or both of the known signals may be derived from the stage's movement.

Since the X',Y' axes of the fiducial grid may be oriented at an angle to the X,Y axes of the scanning-electron beam, as described with reference to FIGS. 12A and 12B, then correction signals V(t) 1430 and W(t) 1432 must be processed with the rotation unit 1440 before being applied to the X,Y beam deflection apparatus 1460 of the EBL system 1470. The rotation unit outputs correction signals V'(t) 1450 and W'(t) 1452 to the beam deflection apparatus 1460.

The most general description of the operation performed by the rotation unit is as follows:

$$V'(t) = V(t)\cos\theta + W(t)\sin\theta$$

$$W'(t) = -V(t)\sin\theta + W(t)\cos\theta$$

where the values of $\cos\theta$ and $\sin\theta$ are determined by the angle between the X',Y' axes 1200 and the X,Y axes 1210, shown in FIG. 12A. The correction signals V'(t) 1450 and W'(t) 1452, which are applied to the beam deflection apparatus 1460, shift the position of the scanning-electron beam slightly in the EBL system 1470. The positional shift of the scanning beam subsequently shifts the phases of the signals $a_2(t)$ 1406 and $b_2(t)$ 1408 derived from the X' and Y' axes of the fiducial grid. In this manner, the EBL system 1470 acts as a voltage-controlled phase shifter.

The delay-locked loop 1400 described with reference to FIG. 14 can be fabricated from discrete electronic components into an external analog or digital circuit. Alternatively, it can be fabricated as a single integrated circuit. Alternatively, the phase-locking functions can be performed with a digital-signal processing chip (DSP) or microprocessor used in the SPLEBL system.

A scintillating fiducial grating or grid can be used in conjunction with spatial-phased-locked electron-beam lithography, or energy beam locating, and a delay-locked loop to define a distortion-free grating which is replicated or reproduced in similar form. Distortion-free gratings can be used for a variety of applications including SPLEBL, or energy beam locating. These gratings can also be used for high-quality optical, integrated optical, or electro-optical devices. These gratings can be used to produce distortion-free grids. The term distortion, used in this context, means that the spatial period, or the spatial phase, of the grating deviates from the desired grating design. At present, large area distortion-free gratings are not known to exist.

Many gratings have either random distortions or systematic distortions. Random distortions might arise if the grating is fabricated in segments and the segments are not located precisely with respect to other segments. Systematic distortions are common to gratings produced by interferometric lithography, where there is a known deviation in grating period, or grating phase, across the surface of the grating. For example, if a linear grating is desired, then the grating's spatial period, $\Lambda$, should be constant everywhere on the grating. If the grating period varies systematically at different locations on the grating surface by a predictable or known amount, then the grating's spatial period can be described by a function $\Lambda(X',Y')$. If the variation in grating period is random, then the grating's spatial period cannot be described by a single function.

Figure 15:
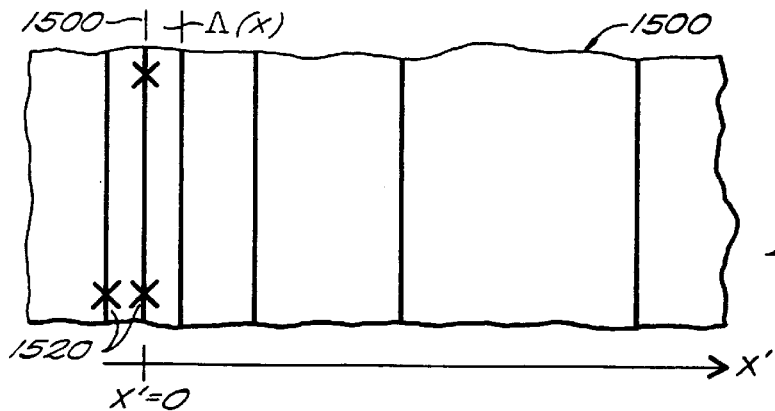
FIG. 15 is a bottom view of a grating mask, which is distorted in one dimension, in which the grating period varies in the X' direction.

An exemplary method for fabricating a distortion-free grating in accordance with the invention, by using a fiducial grating or grid with a systematic distortion and SPLEBL, is shown in FIG. 15. In this example, a grating with known systematic distortion has been fabricated by means known to those skilled in the art onto an optical mask 1500. The approximate spatial period of the grating can be 1 µm. In this one-dimensional example, the systematic distortion of the grating's period 1510 can be described by the function $$\Lambda(X') = \Lambda_0(1 + \kappa X'^2)$$

where $\Lambda_0$ can be 1 µm, and $\kappa$ is a constant. The mask also contains some distinguishing fiducial marks 1520, which are used for positional references on the grating and for subsequent mask to substrate alignment. These fiducial marks 1520 can be moiré alignment marks (as described by Moon et al., J. Vac. Sci. Technol. B, Vol. 13, No. 6, p. 2648–2652 (1995)) which will enable high alignment accuracy of the mask to the substrate.

The grating with known distortion is used to fabricate a scintillating fiducial grating or grid on a resist/substrate composite by a process which might include optical proximity lithography or other techniques known to those skilled in the art, and previously described. The scintillating fiducial grating or grid is then to be used to pattern a distortion-free grating in the resist/substrate composite by using the method of spatial-phase-locked electron-beam lithography or energy beam locating. Since the distortion is known, it can be corrected in the SPLEBL system.

For example, suppose a distortion-free linear grating is desired, for which the grating period, $\Lambda_0$, is constant everywhere on the substrate. In this example, the spatial period of the grating pattern, which is to be written by the SPLEBL system, would have the following functional form:

$$\Lambda(X') = \Lambda_0(1 - \kappa X'^2)$$

The correction term, $-\kappa X'^2$, in the pattern to be written with the SPLEBL system is equal and opposite in magnitude to the known distortion of the distorted-grating mask 1500. The resulting grating pattern defined in the resist/substrate composite will be the desired distortion-free linear grating, provided that the origin, X'=0, of the distorted fiducial grating 1500 has been identified correctly.

If the origin of the distorted fiducial grating 1500 has been improperly identified, the distortion will not be completely canceled. Identifying the origin, X'=0, of the fiducial grating on the optical mask, and on any fiducial grating fabricated from the mask, can be done with a multistep process. However, once the origin is found, then it is known for all times and for all fiducial gratings or grids fabricated from a master mask.

Figure 16A:
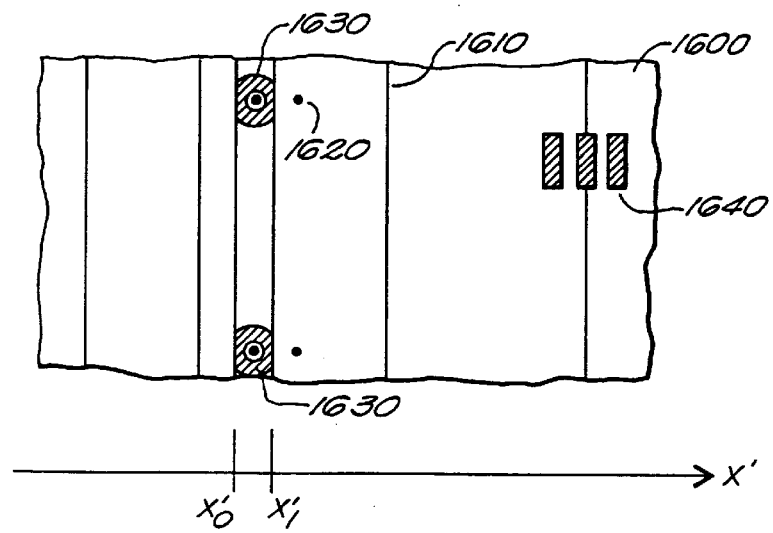
FIGS. 16A and 16B depict a method for determining the center of a distorted-grating mask.
Figure 16B:
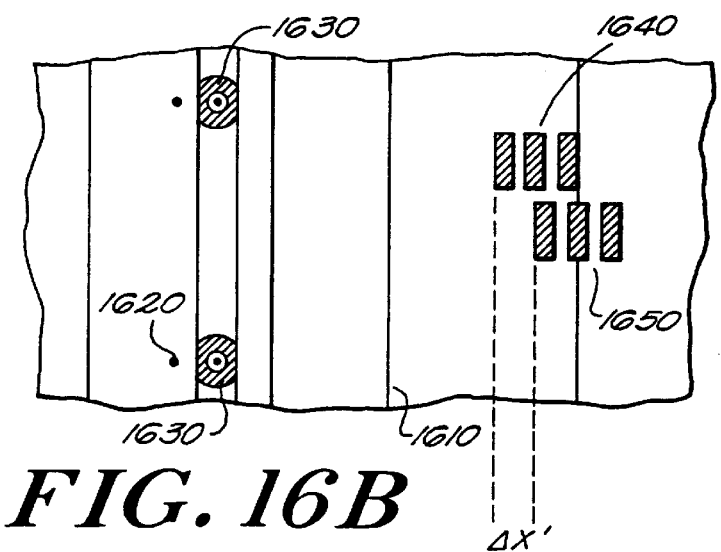

An exemplary method for identifying the origin of a fiducial grating with a systematic distortion in accordance with the invention is depicted in FIGS. 16A and 16B. Fundamentally, this process performs a symmetry operation, X' is mapped into -X', and compares the grating at values greater than X'=0, with the same grating at values less than X'=0. For this one-dimensional example, the symmetry operation can performed by a 180 degree rotation of the distorted fiducial grating.

An optical mask 1600 is used to define a fiducial grating 1610 on a resist/substrate composite (Step 1). Fiducial marks 1620 are also defined on or in the resist/substrate composite. The resist/substrate composite with the fiducial grating is then be used in a SPLEBL system. Fiducial marks 1630 are then defined in the resist/substrate composite as permanent features, which can be done by those skilled in the art (Step 2).

Additional fiducial features 1640 are then defined permanently in the resist substrate composite, away from the assumed grating's origin, $X'_1$ (Step 3). These features 1640 are located with reference to the fiducial grating 1610. Preferably, the features 1640 are gratings or grids so that their phase may be measured. The resist/substrate composite will then have the fiducial grating and resist removed so that only the fiducial marks 1630 and reference marks 1640 remain (Step 4). Then, a new layer of resist is spun onto the substrate (Step 5). Next, Step 1 is repeated, however, the mask is rotated 180 degrees and aligned to the fiducial marks 1630 on the substrate, as shown in FIG. 16B. Step 3 is repeated producing fiducial marks 1650 on the resist/substrate composite. Then, the fiducial marks 1640, 1650 are inspected for a positional shift, $\Delta X'$.

If the fiducial marks 1640 are shifted, $\Delta X'$, with respect to the fiducial marks 1650, then the assumed origin, $X'_1$, of the distorted grating on the optical mask 1600 was in error. The magnitude of the shift, ΔX', between the fiducial marks can be used, along with the known distortion of the grating to determine the size of the error between the assumed origin, $X'_1$, and the distorted gratings true origin, $X'_0$. The process can be iterated until the shift in the fiducial marks, ΔX', vanishes or reduces to an acceptable value. Thus, the true origin of the grating can be determined.

For a grating with two-dimensional systematic distortion, such as described by Ferrera et al., the process involves more steps, and the use of two master masks, where one mask is the mirror image of the other. (A mirror-image mask, instead of a 180 degree rotation, can be used to find the distorted-grating's center in the previously described process.) A mirror-image mask can be readily produced from a master mask by those skilled in the art of lithography. The mirror-image mask and original mask are used to perform two symmetry operations for the fiducial grating: X' is mapped into −X' and Y' is mapped into −Y'. Finding the origin for a two-dimensional distorted grating can be done following the previously described processes by those skilled in the art.

Once a distortion-free grating is fabricated, it can be replicated by a variety of lithographic techniques known to those skilled in the art. Such techniques can include near-field holography (NFH) and achromatic interferometric lithography (AIL). Some techniques, such as AIL, can be used to halve the spatial period of the distortion-free master grating.

Scintillating or fluorescing fiducial patterns can be used in the alignment, or spatial positioning, of a mask to a substrate, where any pattern on the mask is to be transferred or imaged onto said substrate. Scintillating fiducial patterns can be used to position one substrate or sample or device with respect to a second substrate, sample or device. Scintillating fiducial patterns can be used to detect motion between two substrates or samples.

Exemplary embodiments of scintillating or fluorescing fiducial patterns in accordance with the invention, which can be used in mask alignment, are shown in FIGS. 17A–17D. The patterns shown in FIGS. 17C and 17D can be used to position or detect motion between one substrate, sample or device and a second substrate, sample or device.

Figure 17A:
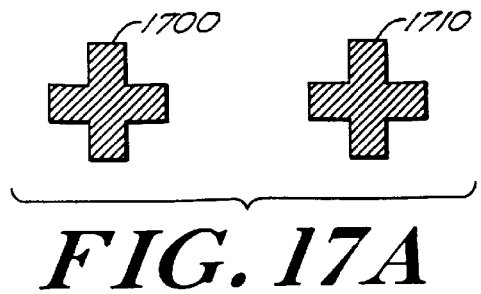
FIGS. 17A–17D represent various scintillating and non-scintillating fiducial patterns which can be used for spatial alignment, positioning or motion detection.
Figure 17B:
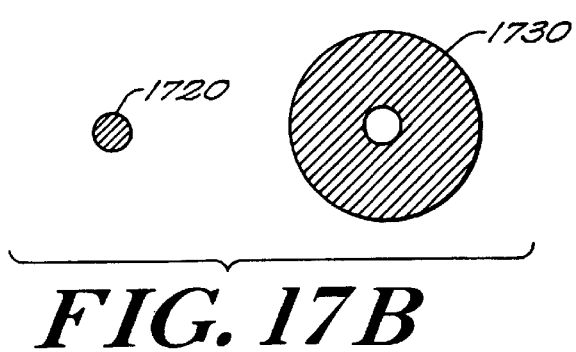

For mask-to-substrate alignment, one of the scintillating or fluorescing fiducial patterns, for example the cross 1700, the dot 1720, the grating 1740, or the grid 1760 are located on the substrate, while the respective corresponding patterns 1710, 1730, 1750 or 1770 would be located on the mask. In the case of FIGS. 17A and 17B, both fiducial patterns 1700 and 1710, or 1720 and 1730, can be fabricated from scintillators or fluorescent material. However, one pattern 1700, or 1720, will scintillate or fluoresce at a wavelength which is different from the wavelength emitted from the other respective corresponding pattern 1710, or 1730. Spectrally resolved imaging can then be used to position the patterns such that the two patterns coincide.

Alternatively, the fiducial pattern 1710, or 1730, can be composed of an optically opaque material which blocks radiation emitted from the scintillating or fluorescing pattern 1700 or 1720. Alignment for the patterns in FIG. 17A can then be achieved when the radiation from the scintillating or fluorescing pattern 1700 is maximally blocked. Alignment for the patterns in FIG. 17B can be achieved when the radiation from the scintillating or fluorescing pattern 1720 is maximally transmitted or generated.

Figure 17C:
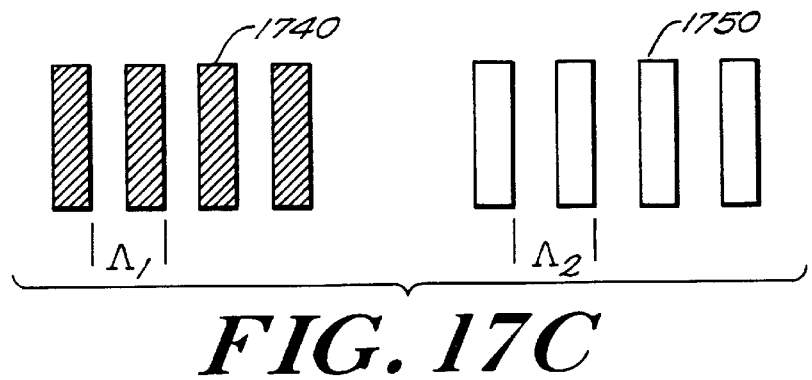
Figure 17D:
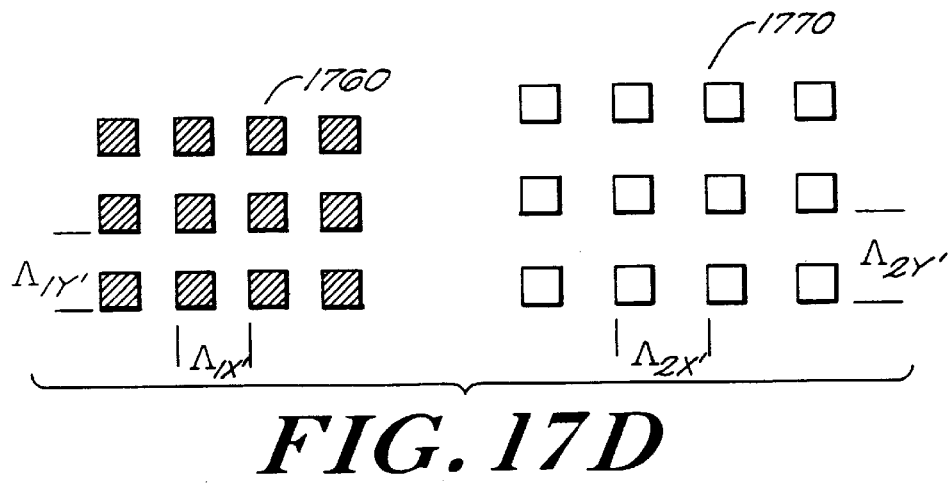

For the fiducial gratings and grids of FIGS. 17C and 17D, one of the patterns 1740, or 1760, can be composed of scintillating or fluorescing material, while the other respective corresponding pattern 1750, or 1770, can be fabricated from optically opaque material. In the application for the patterns of FIG. 17C, the spatial period, $\Lambda_2$, of the opaque grating 1750 differs slightly from the spatial period, $\Lambda_1$, of the scintillating or fluorescing grating 1740, such that a moire image can be obtained from the two patterns. In the application for the patterns of FIG. 17D, the spatial periods, $\Lambda_{2X'}$, $\Lambda_{2Y'}$, of the opaque grid 1770 differ slightly from the spatial periods, $\Lambda_{1X'}$, $\Lambda_{1Y'}$, of the scintillating or fluorescing grid 1760, such that a moiré image can be obtained from the two fiducial patterns. Alignment using moiré images, and the moiré effect, is well understood by those skilled in the art.

Spatial positioning or detection of motion between two substrates, samples or devices, can also be accomplished with the fiducial patterns of FIGS. 17C and 17D. In this application, the moiré image produced by the fiducial patterns is optically imaged and processed to detect sample position and motion. A movement in one sample's position relative to the other sample is apparent as a movement in the moiré image. Analysis of sample motion based upon the movement of a moiré image can readily be done by those skilled in the art.

Detection of the scintillating fiducial patterns can be done by several means. In one scheme, an optical imaging system can be used to project the image of the scintillating fiducial pattern onto a charge-coupled device camera. This method is easily achieved by those skilled in the art.

Detection of the scintillating fiducial grid used in conjunction with SPLEBL, or energy beam locating, can be done with lenses, optical fibers, wavelength separation devices, photodiodes or photomultiplier tubes. An example of a wavelength separation device is an optical interference filter, which reflects radiation in a narrow spectral band and transmits radiation outside that band, or visa versa. These components are well understood by those skilled in the art of optical detection.

Figure 18A:
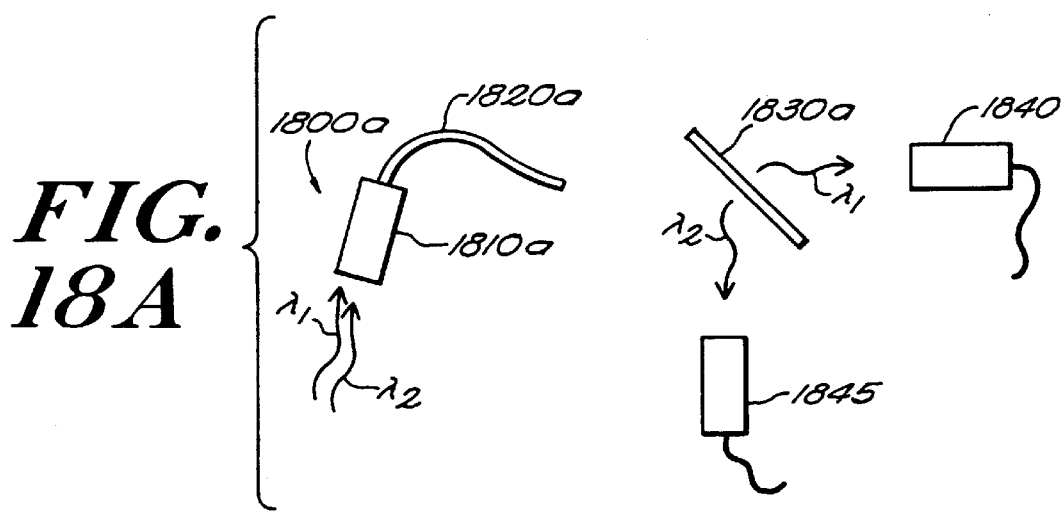
FIGS. 18A–18D depict optical and electron/optical detection schemes and detectors which may be used to detect a scintillating fiducial grid used in energy beam locating.
Figure 18B:
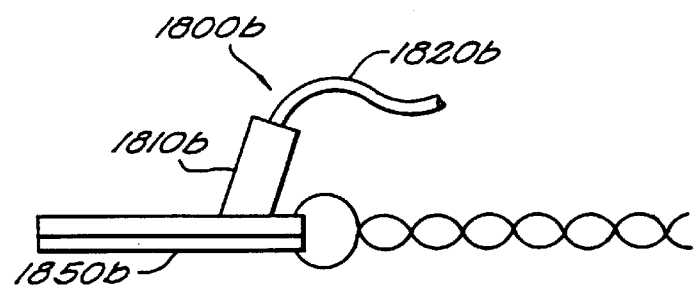
Figure 18C:
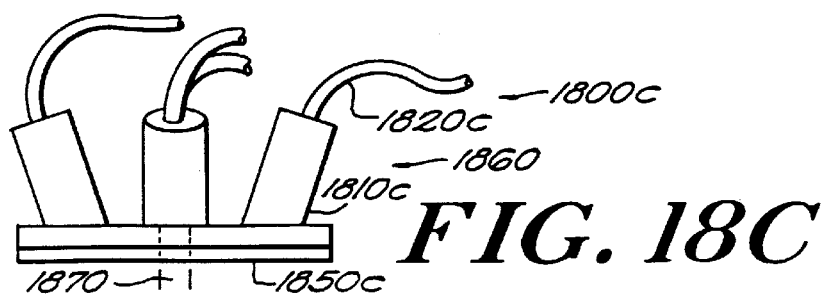
Figure 18D:
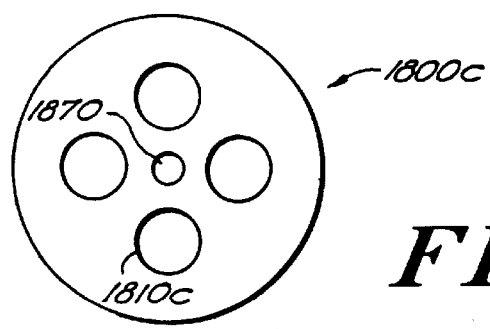

Examples of optical detection apparatus for SPLEBL, which makes use of a scintillating or luminescent grid, are shown in FIGS. 18A–18D. An exemplary optical detection apparatus 1800*a* in accordance with the invention is shown in FIG. 18A. In FIG. 18B, an optical detection apparatus 1800*b* is combined with an electron detector 1850*b*. A more complicated detection apparatus 1800*c* is shown in FIGS. 18C and 18D.

The optical detection apparatus 1800*a* of FIG. 18A is comprised of a lens 1810*a*, a lens-coupled optical fiber 1820*a*, a wavelength separation device 1830*a* and two photodetectors 1840, 1845. This apparatus is used to detect emission from a two-wavelength scintillating fiducial grid as described with reference to FIG. 11A. If a fiducial grid or grating is used which scintillates at one wavelength, then the wavelength splitter 1830 and one photodetector 1840 or 1845 may be omitted. Photomultipliers can be used as photodetectors for low-level signals. The lens 1810*a*, which can be a graded-refractive-index lens, at one end of the fiber is located on a suitable mounting assembly inside the SPLEBL system near the scanning-electron beam and collects photons emitted from the scintillating fiducial grid. The photons are then transported by the optical fiber 1820*a* to the photodetectors which are located within or external to the SPLEBL system.

To obtain more sensitive signal detection, several of these detection apparatus can be used simultaneously in the method of coincidence detection. Coincidence detection is well understood by those skilled in the art of scintillation detection, and is a method to reduce detection noise. It is basically described as the detection of simultaneous events on each detector.

In FIG. 18B, the optical-detection apparatus 1800b is combined with an electron-detection apparatus 1850b. The electron-detection apparatus can be a backscattered electron detector or a secondary electron detector, which are well understood by those skilled in the art. Such a combined optical/electron detection apparatus can be used to detect the signals from a bimaterial fiducial grid described with reference to FIG. 11C, or to improve signal detection from the scintillating fiducial grids described with reference to FIGS. 11A and 11B. For the bimaterial grid of FIG. 11C, electrons and photons emitted from the grid can be detected with this apparatus. The optical/electron detection assembly would be located in the SPLEBL system near the scanning beam.

Signal detection can be improved with the optical/electron detector for the scintillating grids described with reference to FIGS. 11A and 11B by subsequently processing the signals from the electron detector and the optical detection apparatus. Both signals are modulated with identical periodicity and will either be in phase or out of phase by 180 degrees. If the signals are out of phase, then they can be put in phase by processing techniques known to those skilled in the art. To improve the signal contrast, the two signals should be in phase and multiplied together. Several combined optical/electron detection apparatus can also be used in the method of coincidence detection for a further improvement in signal quality. The combined optical/electron detector can be fabricated as a combined device or located separately in the SPLEBL system.

FIGS. 18C and 18D respectively show side and bottom views of a compact apparatus 1800c which includes a plurality of lenses 1810c and lens-coupled fibers 1820c, and an electron detector 1850c. The assembly is mounted in the scanning-energy-beam system near the resist/substrate composite. A hole 1870 in the center of the device allows the scanning beam to pass through the detector assembly. Thus, the assembly can be mounted directly above the scintillating fiducial grid or grating.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A fiducial pattern provided on a substrate adapted for the creation of an image thereon in response to impingement of a beam of energy, said fiducial pattern including a scintillator that generates a photonic signal in response to being impinged by a beam of energy said photonic signal being utilized to precisely locate the position of said image on said substrate.

2. The fiducial pattern of claim 1, wherein said scintillator comprises an organic compound.

3. The fiducial pattern of claim 1, wherein said scintillator comprises an inorganic compound.

4. The fiducial pattern of claim 1, wherein said scintillator comprises a non-metallic compound.

5. The fiducial pattern of claim 1, wherein an image is created on said substrate with a method of energy beam locating.

6. The fiducial pattern of claim 1, wherein said scintillator emits photons of a first predetermined wavelength to define said photonic signal.

7. The fiducial pattern of claim 6 further comprising a second scintillator that emits photons of a second predetermined wavelength which forms part of said photonic signal.

8. The fiducial pattern of claim 7, wherein said first and second predetermined wavelengths correspond to x and y coordinate locations, respectively, of said beam on said substrate.

9. The fiducial pattern of claim 1, wherein said scintillator comprises a grid defining said fiducial pattern, said grid including gratings corresponding to x and y coordinate axes, respectively.

10. The fiducial pattern of claim 9, wherein said gratings comprise scintillating gratings and non-scintillating gratings.

11. The fiducial pattern of claim 1, wherein said scintillator is incorporated with a layer of resist provided on the surface of said substrate.

12. The fiducial pattern of claim 1, wherein said scintillator comprises a scintillating resist composite.

13. The fiducial pattern of claim 1, wherein said scintillator comprises buckeyballs.

14. The fiducial pattern of claim 1, wherein said scintillator comprises photoluminescent nanocrystals.

15. A system for locating a beam of energy which creates an image on a substrate, said system comprising:

a scintillating fiducial pattern provided on said substrate; and means for detecting a photonic signal generated by the interaction of said beam and said scintillating fiducial pattern, said photonic signal representative of the location of said beam with respect to said fiducial pattern.

16. The system of claim 15, wherein said fiducial pattern comprises an organic compound.

17. The system of claim 15, wherein said fiducial pattern comprises an inorganic compound.

18. The system of claim 15, wherein said fiducial pattern comprises a non-metallic compound.

19. The system of claim 15, wherein said image is created on said substrate with a method of energy beam locating.

20. The system of claim 15, wherein said fiducial pattern comprises a first scintillator that emits photons of a first predetermined wavelength to define said photonic signal.

21. The system of claim 20, wherein said fiducial pattern comprises a second scintillator that emits photons of a second predetermined wavelength which forms part of said photonic signal.

22. The system of claim 21, wherein said first and second predetermined wavelengths correspond to x and y coordinate locations, respectively, of said beam on said substrate.

23. The system of claim 15, wherein said fiducial pattern comprises a grid which includes gratings corresponding to x and y coordinate axes, respectively.

24. The system of claim 23, wherein said gratings comprise scintillating gratings and non-scintillating gratings.

25. The system of claim 15, wherein said fiducial pattern is incorporated with a layer of resist provided on the surface of said substrate.

26. The system of claim 15, wherein said fiducial pattern comprises a scintillating resist composite.

27. The fiducial pattern of claim 15, wherein said fiducial pattern comprises buckeyballs.

28. The fiducial pattern of claim 15, wherein said fiducial pattern comprises photoluminescent nanocrystals.

29. A method of locating a beam of energy which creates an image on a substrate, said method comprising:

providing a scintillating fiducial pattern on said substrate; and detecting a photonic signal generated by the interaction of said beam and said scintillating fiducial pattern, said photonic signal representative of the location of said beam with respect to said fiducial pattern.

30. A substrate which is adapted for the creation of an image thereon in response to impingement of a beam of energy, said substrate comprising a fiducial pattern including a scintillator that generates a photonic signal in response to being impinged by said beam, said photonic signal being representative of the location of said beam with respect to said fiducial pattern.

31. A method of mask-to-substrate alignment comprising:

providing a first fiducial pattern on a substrate;

providing a second fiducial pattern on an optical mask, said second fiducial pattern corresponding to said first fiducial pattern, at least one of said first and second fiducial patterns comprising a scintillator;

radiating said mask and substrate to determine whether said first and second fiducial patterns coincide.

32. A system for aligning an optical mask and a substrate, said system comprising:

a first fiducial pattern on said substrate;

a second fiducial pattern on said mask, said second fiducial pattern corresponding to said first fiducial pattern, and wherein at least one of said first and second fiducial patterns comprising a scintillator such that the coincidence of said first and second fiducial patterns can be determined in response to radiating said mask and substrate.

33. A system for locating a beam of energy which creates an image on a substrate, said system comprising:

a scintillating fiducial pattern provided on said substrate, said pattern having elements with first and second axes which are orthogonal to one another;

means for detecting first and second photonic signals generated by the interaction of said beam and said scintillating fiducial pattern, said first and second photonic signals representative of the location of said beam with respect to said first and second axes, respectively, of said pattern; and first and second delay locked loops operable for spatial-phase-locking of said first and second photonic signals with respect to predetermined first and second reference signals.

* * * * *

UNITED STATES PATENT AND TRADEMARK OFFICE
CERTIFICATE OF CORRECTION

| | | |
|---|---|---|
| PATENT NO. | : 5,892,230 | Page 1 of 1 |
| APPLICATION NO. | : 08/865095 | |
| DATED | : April 6, 1999 | |
| INVENTOR(S) | : James G Goodberlet | |

It is certified that error appears in the above-identified patent and that said Letters Patent is hereby corrected as shown below:

Please delete the paragraph titled 'SCINTILLATING FIDUCIAL PATTERNS' encompassing column 1, lines 4-6:

"This invention was made with government support under Grant No. DAAH04-95-1-0564 awarded by the U.S. Army. The government has certain rights in the invention."

and replace with:

--This invention was made with government support under Grant No. DAAH04-95-1-0564 awarded by the Army Research Office and Grant No. ECS9407078 awarded by the National Science Foundation. The government has certain rights in this invention.--

Signed and Sealed this
Twenty-third Day of October, 2012

David J. Kappos
*Director of the United States Patent and Trademark Office*